United States Patent
Tsuchi et al.

(10) Patent No.: US 11,568,831 B2
(45) Date of Patent: Jan. 31, 2023

(54) OUTPUT CIRCUIT, DATA DRIVER, AND DISPLAY APPARATUS

(71) Applicant: LAPIS Technology Co., Ltd., Yokohama (JP)

(72) Inventors: Hiroshi Tsuchi, Yokohama (JP); Manabu Nishimizu, Yokohama (JP)

(73) Assignee: LAPIS Technology Co., Ltd., Yokohama (JP)

( * ) Notice: Subject to any disclaimer, the term of this patent is extended or adjusted under 35 U.S.C. 154(b) by 0 days.

(21) Appl. No.: 17/672,645

(22) Filed: Feb. 15, 2022

(65) Prior Publication Data

US 2022/0270563 A1 Aug. 25, 2022

(30) Foreign Application Priority Data

Feb. 19, 2021 (JP) .............................. JP2021-025159

(51) Int. Cl.
*G09G 3/36* (2006.01)
*H03K 17/687* (2006.01)
*G02F 1/1362* (2006.01)
*G02F 1/133* (2006.01)

(52) U.S. Cl.
CPC ......... *G09G 3/3685* (2013.01); *G09G 3/3614* (2013.01); *H03K 17/6872* (2013.01); *G02F 1/13306* (2013.01); *G02F 1/136286* (2013.01)

(58) Field of Classification Search
CPC combination set(s) only.
See application file for complete search history.

(56) References Cited

U.S. PATENT DOCUMENTS

| 5,491,661 | A  | * | 2/1996  | Motomura | G11C 11/412 365/230.01 |
|---|---|---|---|---|---|
| 6,426,910 | B1 | * | 7/2002  | Santin | G11C 29/70 365/225.7 |
| 9,275,596 | B2 | * | 3/2016  | Suzuki | G09G 3/3688 |
| 10,818,216 | B2 | * | 10/2020 | Takahashi | G09G 3/3225 |
| 2008/0089003 | A1 | * | 4/2008  | Kojima | G09G 3/20 361/246 |
| 2020/0312263 | A1 | * | 10/2020 | Orii | G09G 3/3688 |

FOREIGN PATENT DOCUMENTS

JP 2008102211 5/2008

* cited by examiner

*Primary Examiner* — Van N Chow
(74) *Attorney, Agent, or Firm* — JCIPRNET

(57) ABSTRACT

An output circuit includes a first switch that outputs a positive voltage signal received via a first node when in an ON state, a second switch that outputs a negative voltage signal received via a second node when in an ON state, third and fourth switches that set the first and second nodes to a reference power supply voltage when in an ON state, a first follower circuit that generates, as a gate voltage, a voltage signal following and being in phase with a voltage signal of the first node through source follower operation and supplies the gate voltage to a gate of the first switch, and a second follower circuit that generates, as a gate voltage, a voltage signal following and being in phase with a voltage signal of the second node through source follower operation and supplies the gate voltage to a gate of the second switch.

20 Claims, 11 Drawing Sheets

OUTPUT CIRCUIT, DATA DRIVER, AND DISPLAY APPARATUS

CROSS-REFERENCE TO RELATED APPLICATION

This application claims the priority benefit of Japan application serial no. 2021-025159, filed on Feb. 19, 2021. The entirety of the above-mentioned patent application is hereby incorporated by reference herein and made a part of this specification.

BACKGROUND

Technical Field

The present disclosure relates to an output circuit that selectively outputs either a positive voltage or a negative voltage, a data driver that drives a display panel, and a display apparatus.

Related Art

Liquid crystal display apparatuses in which an active matrix drive type liquid crystal panel is used for a display device have become generally known as a main type of display apparatuses in recent years.

A liquid crystal panel includes a plurality of data lines each extending in the vertical direction of the two-dimensional screen and a plurality of gate lines each extending in the horizontal direction of the two-dimensional screen, the data lines and gate lines being disposed to intersect each other. Furthermore, a pixel part connected to a data line and a gate line is formed at each of the intersection parts of the plurality of data lines and the plurality of gate lines.

A liquid crystal display apparatus includes, along with the liquid crystal panel, a data driver that supplies a gradation data signal having an analog voltage value corresponding to the luminance level of each pixel to the data lines at a data pulse in units of one horizontal scanning period.

The data driver performs polarity inversion driving to supply a positive gradation data signal and a negative gradation data signal in an alternating manner to the liquid crystal panel in every predetermined frame period in order to prevent degradation of the liquid crystal panel.

As an output circuit that performs such polarity inversion driving, an output circuit provided with a switch group that receives a positive drive voltage and a negative drive voltage corresponding to gradation data signals, alternately selects one of the voltages, and outputs the selected voltage to the liquid crystal panel has been proposed (e.g., see SW1 to SW12 of FIGS. 8 to 10 of Patent Document 1: Japanese Patent Application Laid-Open (JP-A) No. 2008-102211).

By using the switches SW1 to SW12, the output circuit described in Patent Document 1 switches from the state in which a positive drive voltage (5 V) is output from an output pad OUT 1 (the state of FIG. 8 of the same document) to the state in which a negative drive voltage (−5 V) is output from the output pad OUT 1 (the state of FIG. 10 of the same document).

Furthermore, by performing the polarity switching as described above, the output circuit described in Patent Document 1 sets one end of each switch to the state of 0 V first as illustrated in FIG. 9 of the same document and then switches to the state illustrated in FIG. 10 of the same document. As a result, a withstanding voltage of each switch can be configured to be a low withstanding voltage that is half of the range of a liquid crystal drive voltage.

In Patent Document 1 (FIGS. 8 to 10 of the same document), the output selection switches (SW5 to SW8) connected to OUT1 and OUT2 can be elements with a low withstanding voltage that is half of the range of the liquid crystal drive voltage.

However, in a case in which the switches are configured as transistor switches with a low-withstanding voltage that is half of the range of the liquid crystal drive voltage, they are not suitable for being used in complementary switches in which P channel type switches and N channel type switches are combined due to the following reasons, and thus it is desirable to configure the switches as single conductive transistor switches.

For example, it may be assumed that a range of a positive drive voltage value is VGND (0 V) to VDDH (5 V), and a range of a negative drive voltage value is VDDL (−5 V) to VGND (0 V). Here, a case in which the output selection switch SW5 that outputs a positive drive voltage disclosed in Patent Document 1 (FIGS. 8 to 10 of the same document) is configured as an N-channel transistor switch will be considered. Because the N-channel transistor switch SW5 outputs a positive drive voltage to be supplied to a first terminal, a maximum positive power supply voltage VDDH is supplied to the control terminal. Here, when the output terminal OUT1 connected to the second terminal of the N-channel transistor switch SW5 is driven with the reference power supply voltage VGND due to polarity inversion from negative to positive, if the output terminal OUT1 does not sufficiently approach the reference power supply voltage VGND from a negative drive voltage, there is a risk of a voltage difference between the control terminal of the N-channel transistor switch SW5 and the output terminal OUT1 connected to the second terminal exceeding a withstanding voltage. In order to avoid this risk, it is necessary to secure a sufficient drive time for the reference power supply voltage VGND to the output terminal OUT1 at the time of polarity inversion, but high-speed driving under operation condition with a short output period is difficult.

In addition, in a case in which a positive drive voltage value is close to the positive power supply voltage VDDH, even if the positive power supply voltage VDDH is supplied to the control terminal of the N-channel transistor switch SW5, it is not possible to output the positive power supply voltage VDDH in the range of the threshold voltage of the N-channel transistor.

On the other hand, a case in which the output selection switch SW5 is configured as a P-channel transistor switch may be considered. Because the P-channel transistor switch SW5 outputs a positive drive voltage to be supplied to the first terminal, control is performed such that a voltage within a withstanding voltage that is lower than the positive drive voltage is supplied to the control terminal of the transistor switch. In this case, there is no risk of the voltage difference between the control terminal of the P-channel transistor switch SW5 and the output terminal OUT1 connected to the second terminal exceeding the withstanding voltage. In addition, if a voltage supplied to the control terminal of the P-channel transistor switch SW5 is controlled appropriately for a positive drive voltage, any positive drive voltage can be output from the P-channel transistor switch SW5.

Thus, an output selection switch that outputs a positive drive voltage is optimally configured solely by a P-channel transistor switch. Likewise, an output selection switch that outputs a negative drive voltage is optimally configured solely by an N-channel transistor switch.

However, in the configuration in which an output selection switch is configured by a single conductive transistor switch, when a positive drive voltage near the reference power supply voltage VGND is output to the control terminal of the P-channel transistor switch that outputs a positive drive voltage, control across polarities in which a negative voltage is supplied is needed. Similarly, control across the polarities also needed for the control terminal of the N-channel transistor that outputs a negative drive voltage.

However, such control across the polarities, that is, control of switching the polarity of the voltage to be supplied to the control terminal of the transistor switch, is difficult.

SUMMARY

An output circuit according to an embodiment of the present disclosure includes a positive voltage signal supply circuit that supplies a positive voltage signal having a higher voltage than a reference power supply voltage to a first node or cuts off supply of the positive voltage signal to the first node, a negative voltage signal supply circuit that supplies a negative voltage signal having a lower voltage than the reference power supply voltage to a second node or cuts off supply of the negative voltage signal to the second node, a first output terminal, a first switch that is a P-channel transistor with a source connected to the first node and a drain connected to the first output terminal, connects the first output terminal to the first node when in an ON state, and cuts off connection of the first output terminal to the first node when in an OFF state, a second switch that is an N-channel transistor with a source connected to the second node and a drain connected to the first output terminal, connects the first output terminal to the second node when in an ON state, and cuts off connection of the first output terminal to the second node when in an OFF state, a third switch that applies the reference power supply voltage to the first node when in an ON state and stops application of the reference power supply voltage to the first node when in an OFF state, a fourth switch that applies the reference power supply voltage to the second node when in an ON state and stops application of the reference power supply voltage to the second node when in an OFF state, a first control section that, when active, sets the first switch to be in the OFF state, a second control section that, when active, sets the second switch to be in the OFF state, a first follower circuit that is connected to the first node and a gate of the first switch, includes a first N-channel source follower transistor that performs a source follower operation by receiving a voltage signal of the first node at a gate of the first N-channel source follower transistor, and generates a first gate voltage in phase with the voltage signal of the first node according to a voltage of a source of the first N-channel source follower transistor, and supplies the first gate voltage to the gate of the first switch, and a second follower circuit that is connected to the second node and a gate of the second switch, includes a first P-channel source follower transistor that performs a source follower operation by receiving a voltage signal of the second node at a gate of the first P-channel source follower transistor, and generates a second gate voltage in phase with the voltage signal of the second node according to a voltage of a source of the first P-channel source follower transistor, and supplies the second gate voltage to the gate of the first switch.

In addition, a data driver according to an embodiment of the present disclosure includes a plurality of above-described output circuits, and outputs a plurality of gradation voltage signals having a positive or negative voltage value for driving a plurality of data lines of a liquid crystal display panel from the plurality of output circuits.

In addition, a display apparatus according to an embodiment of the present disclosure includes a plurality of above-described output circuits, and outputs a plurality of gradation voltage signals having a positive or negative voltage value from the plurality of output circuits.

In the output circuit according to the present disclosure, when the first switch (P-channel transistor) receives a positive voltage signal with a voltage higher than the reference power supply voltage via the first node, the positive voltage signal is output from the output terminal when the first switch is in the ON state. Furthermore, when the second switch (N-channel transistor) receives a negative voltage signal with a voltage lower than the reference power supply voltage via the second node, the negative voltage signal is output from the output terminal when the second switch is in the ON state. Here, the first and second follower circuits control the first and second switches as follows. In other words, the first follower circuit generates an in-phase voltage signal following the voltage signal of the first node as the gate voltage through the source follower operation and supplies the voltage signal to the gate of the first switch. The second follower circuit generates an in-phase voltage signal following the voltage signal of the second node as the gate voltage through the source follower operation and supplies the voltage signal to the gate of the second switch. Furthermore, the output circuit includes the third and fourth switches that set the first and second nodes to the reference power supply voltage individually when the switches are in the ON state, and the first and second control sections that set the first and second switches to be in the OFF state individually when the sections are in the active state, sets the second switch to be off and the second node to the reference power supply voltage when the positive voltage signal is to be output from the output terminal, and sets the first switch to be off and the first node to the reference power supply voltage when the negative voltage signal is to be output from the output terminal.

With the above-described configuration, for each switch that handles the positive voltage signal with a voltage higher than the reference power supply voltage and the negative voltage signal with a voltage lower than the reference power supply voltage, a transistor with a withstanding voltage that is about half of the voltage range from a minimum voltage of the negative voltage signal to a maximum voltage of the positive voltage signal can be used. Furthermore, simple source follower circuits such as the above-described first and second follower circuits can realize control across polarities over the first and second switches serving as output selection switches.

Therefore, according to the present disclosure, an output circuit that can selectively output one of a positive voltage and a negative voltage, a data driver including the output circuit, and a display apparatus can have a reduced area in a simple configuration.

DETAILED DESCRIPTION

Embodiment of the present disclosure provide an output circuit that can have a reduced area with a simple configuration, and a data driver and a display apparatus to which the output circuit is applied. Hereinafter, the embodiments of the disclosure will be described with reference to the drawings.

Example 1

Figure 1:
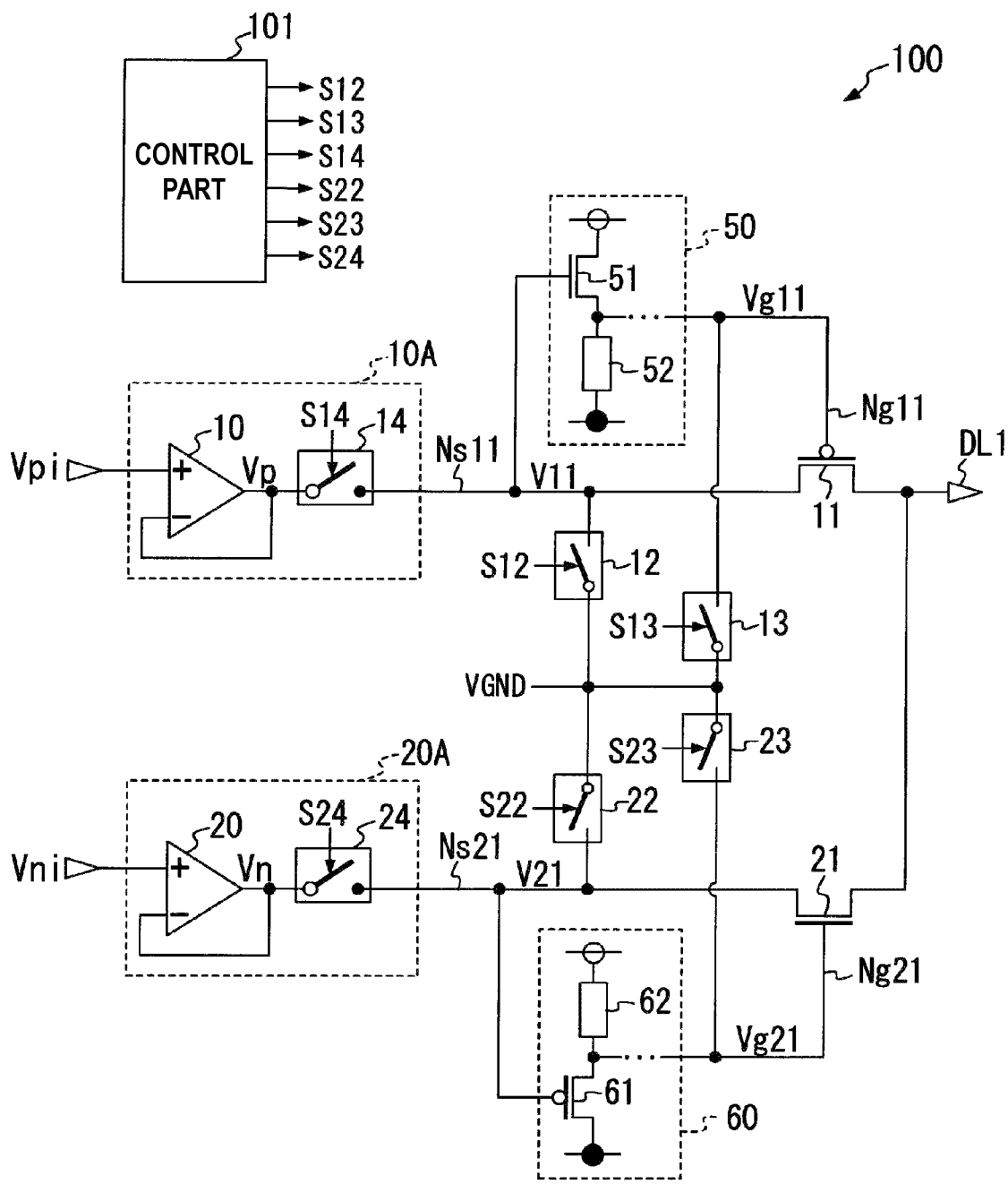
FIG. 1 is a circuit diagram illustrating an example of a configuration of an output circuit 100.

FIG. 1 is a circuit diagram illustrating a configuration of an output circuit 100 as an example of an output circuit according to the present disclosure.

First, power supply voltages to be supplied to the output circuit 100 will be described.

Power supply voltages to be supplied to the output circuit 100 includes a total of five power supply voltages such as a reference power supply voltage VGND, a high power supply voltage VDD2H that forms two positive power supply voltages on the high potential side with respect to the reference power supply voltage VGND, a low power supply voltage VDD1H, a high power supply voltage VDD2L that forms two negative power supply voltages on the low potential side with respect to the reference power supply voltage VGND, and a low power supply voltage VDD1L. The five power supply voltages have the potential relationship of VDD2H>VDD1H>VGND>VDD1L>VDD2L. In addition, a potential difference between the positive and negative low power supply voltages VDD1H and VDD1L is set to a value smaller than potential differences between the high power supply voltage VDD2H and the reference power supply voltage VGND, and VDD2L and VGND. Further, the following examples will be described on the assumption that a power supply configuration of the five power supply voltages can be applied to each of the examples of the output circuit of the present disclosure.

The output circuit 100 receives a signal with a potential higher than or equal to the reference power supply voltage VGND as a positive voltage signal and a signal with a potential lower than or equal to the reference power supply voltage VGND as a negative voltage signal, switches between the positive voltage signal and the negative voltage signal at predetermined timings to output the signals to a capacitive load (e.g., a data line of a liquid crystal display apparatus), and thereby drives the capacitive load (polarity inversion driving).

The output circuit 100 includes a positive voltage signal supply circuit 10A, an output selection switch 11, switches 12 and 13, a negative voltage signal supply circuit 20A, an output selection switch 21, switches 22 and 23, follower circuits 50 and 60, and a control part 101. Furthermore, the output circuit 100 includes nodes Ns11 and Ns21, and an output terminal DL1 connected to one capacitive load.

The positive voltage signal supply circuit 10A includes an amplifying circuit 10 and a switch 14. The amplifying circuit 10 receives an input voltage signal Vpi with a potential in the range from the reference power supply voltage VGND to the positive high power supply voltage VDD2H and outputs a signal obtained by amplifying the aforementioned input voltage signal as a positive voltage signal Vp. The switch 14 controls supply of the positive voltage signal Vp to the node Ns11 and cuts off the supply thereof. Further, the switch 14 is configured as a complementary switch with two conductive types of P and N channels for letting a positive voltage signal Vp in a wide voltage range pass therethrough. Both ends of the switch 14 are terminals with the same positive voltage range, and the switch may be simply a complementary switch. In addition, the amplifying circuit 10 may include the functions of the switch 14 therein, and in this case, the node Ns11 serves as the output node of the amplifying circuit 10. Furthermore, the amplifying circuit 10 is not limited to a voltage follower that amplifies and outputs the positive voltage signal Vp with the same potential as that of the input voltage signal Vpi, and it may be an amplifying circuit that amplifies and outputs the positive voltage signal Vp with a potential different from that of the input voltage signal Vpi. In the present specification, a voltage signal to be supplied from the positive voltage signal supply circuit 10A to the node Ns11 will be described as V11 or Vp.

With the above-described configuration, the positive voltage signal supply circuit 10A generates a positive voltage signal Vp with a potential in the range from the reference power supply voltage VGND to the positive high power supply voltage VDD2H, and supplies the voltage to the node Ns11 or cuts off the supply thereof.

The negative voltage signal supply circuit 20A includes an amplifying circuit 20 and a switch 24. The amplifying circuit 20 receives an input voltage signal Vni with a potential in the range from the negative high power supply voltage VDD2L to the reference power supply voltage VGND and outputs a signal obtained by amplifying the aforementioned input voltage signal as a negative voltage signal Vn. The switch 24 controls supply of the negative voltage signal Vn to the node Ns21 and cuts off the supply thereof. Further, the switch 24 is configured as a complementary switch with two conductive types of P and N channels for letting the negative voltage signal Vn in a wide voltage range pass therethrough. Both ends of the switch 24 are terminals with the same negative voltage range, and the switch may be simply a complementary switch. In addition, the amplifying circuit 20 may include the functions of the switch 24 therein, and in this case, an output node of the amplifying circuit 20 is the node Ns21. In addition, the amplifying circuit 20 is not limited to a voltage follower that amplifies and outputs the negative voltage signal Vn with the same potential as that of the input voltage signal Vni, and it may be an amplifying circuit that amplifies and outputs the negative voltage signal Vn with a potential different from that of the input voltage signal Vni. In the present specification, a voltage signal to be supplied from the negative voltage signal supply circuit 20A to the node Ns21 will be described as V21 or Vn.

With the above-described configuration, the negative voltage signal supply circuit 20A generates a negative voltage signal Vn with a potential in the range from the negative high power supply voltage VDD2L to the reference power supply voltage VGND, and supplies the voltage to the node Ns21 or cuts off the supply thereof.

The output selection switch 11 is configured as a P-channel transistor having a first terminal (which will be denoted as a "source" below) connected to the node Ns11 and a second terminal (which will be denoted as a "drain" below) connected to the output terminal DL1. Furthermore, a control terminal (which will be denoted as a "gate Ng11" below) of the output selection switch 11 is connected to the follower circuit 50. With this configuration, the output selection switch 11 outputs the voltage signal V11 of the node Ns11 to the output terminal DL1 when it is in an ON state.

The output selection switch 21 is configured as an N-channel transistor having a source connected to the node Ns21 and a drain connected to the output terminal DL1. Furthermore, a gate Ng21 serving as a control terminal of the output selection switch 21 is connected to the follower circuit 60. With this configuration, the output selection switch 21 outputs the voltage signal V21 of the node Ns21 to the output terminal DL1 when it is in an ON state.

The switch 12 is configured as an N-channel transistor connected between, for example, the node Ns11 and the reference power supply terminal from which the reference power supply voltage VGND is supplied. The switch 12 is controlled such that it is in an ON state or an OFF state according to a control signal S12 supplied from the control part 101. The switch 12 applies the reference power supply voltage VGND to the node Ns11 when it is in the ON state.

The switch 13 is configured as a P-channel transistor connected between, for example, the gate Ng11 of the output selection switch 11 and the reference power supply terminal. The switch 13 is controlled such that it is in an ON state or an OFF state according to a control signal S13 supplied from the control part 101. The switch 13 performs control such that the output selection switch 11 is in the OFF state when it is controlled such that it is in the ON state along with the switch 12. Further, the switch 13 may be replaced with a switch connecting the gate Ng11 of the output selection switch 11 and the node Ns11.

The switch 22 is configured as a P-channel transistor connected between, for example, the node Ns21 and the reference power supply terminal. The switch 22 is controlled such that it is in an ON state or an OFF state according to a control signal S22 supplied from the control part 101. The switch 22 applies the reference power supply voltage VGND to the node NS21 when it is in the ON state.

The switch 23 is configured as an N-channel transistor connected between, for example, the gate Ng21 of the output selection switch (N-channel transistor) 21 and the reference power supply terminal. The switch 23 is controlled such that it is in an ON state or an OFF state according to a control signal S23 supplied from the control part 101. The switch 23 performs control such that the output selection switch 21 is in the OFF state when it is controlled such that it is in the ON state along with the switch 22. Further, the switch 23 may be replaced with a switch connecting the gate Ng21 of the output selection switch 21 and the node Ns21.

As described above, when at least one of the output selection switches 11 and 21 is controlled such that it is in the ON state in the operation in which the switches 12, 13, 22, and 23 output a positive or negative voltage signal (Vp or Vn) to the output terminal DL1, the other is controlled such that it is in the OFF state.

The follower circuit 50 is connected between the node Ns11 to which the source of the output selection switch 11 is connected and the gate Ng11.

The follower circuit 50 includes an N-channel transistor 51 and a load element 52 that at least receive a positive power supply voltage higher than the reference power supply voltage VGND and a negative power supply voltage lower than or equal to the reference power supply voltage VGND, the transistor and the load element being cascade-connected between the two different power supply voltages. A gate of the N-channel transistor 51 receives supply of the voltage signal V11 of the node Ns11, and a drain of the transistor receives application of the above-described positive power supply voltage. One end of the load element 52 receives application of the above-described negative power supply voltage, and the other end is connected to a source of the N-channel transistor 51.

The follower circuit 50 performs a source follower operation in which an in-phase voltage signal with a lower voltage than the voltage signal V11 is output following the voltage signal V11 of the node Ns11 from the connection point of the source of the N-channel transistor 51 and the load element 52. The follower circuit 50 outputs the output voltage signal as a gate voltage Vg11 to the gate Ng11 of the output selection switch 11.

With this configuration, the follower circuit 50 performs control such that a voltage difference (absolute value) between the gate and the source of the output selection switch 11 has a voltage difference higher than a threshold voltage (absolute value) at which the switch maintains the ON state within an element withstanding voltage VDD2T based on the voltage signal V11 of the node Ns11. Thus, according to the operation of the follower circuit 50, the output selection switch 11 can reliably output the positive voltage signal V11 having a potential in the range from the reference power supply voltage VGND to the positive high power supply voltage VDD2H to the output terminal DL1.

The follower circuit 60 is connected between the node Ns21 to which the source of the output selection switch 21 is connected and the gate Ng21.

The follower circuit 60 includes a P-channel transistor 61 and a load element 62 that at least receive a positive power supply voltage higher than the reference power supply voltage VGND and a negative power supply voltage lower than or equal to the reference power supply voltage VGND, the transistor and the load element being cascade-connected between the two different power supply voltages. A gate of the P-channel transistor 61 receives supply of the voltage signal V21 of the node Ns21, and the above-described positive power supply voltage is applied to a drain of the transistor. One end of the load element 62 receives application of the above-described positive power supply voltage, and the other end is connected to a source of the P-channel transistor 61.

The follower circuit 60 performs a source follower operation in which an in-phase voltage signal with a higher voltage than the voltage signal V21 is output following the voltage signal V21 of the node Ns21 from the connection point of the source of the P-channel transistor 61 and the load element 62. The follower circuit 60 supplies the output voltage signal as a gate voltage Vg21 to the gate Ng21 of the output selection switch 21.

With this configuration, the follower circuit 60 performs control such that a voltage difference between the gate and the source of the output selection switch 21 has a voltage difference higher than a threshold voltage (absolute value) at which the switch maintains the ON state within an element withstanding voltage VDD2T based on the voltage signal V21 of the node Ns21. Thus, according to the operation of the follower circuit 60, the output selection switch 21 can reliably output the negative voltage signal V21 having a potential in the range from the negative high power supply voltage VDD2L to the reference power supply voltage VGND to the output terminal DL1.

Further, the load elements 52 and 62 of the follower circuits 50 and 60 can be configured as constant current sources, resistive elements, or circuits that control a constant current or a resistance value.

The above-described switches 12 to 14 and 22 to 24 are controlled such that they are turned on and off, respectively, using the control signals S12 to S14 and S22 to S24 output from the control part 101.

Next, an element withstanding voltage VDD2T of the output circuit 100 illustrated in FIG. 1 will be described.

Further, each element of the output circuit 100 is configured as an element with a low withstanding voltage of the element withstanding voltage VDD2T that is lower than the output voltage range (VDD2H to VDD2L) with respect to the output terminal DL1, and a minimum withstanding voltage is about half of the output voltage range, that is, about a voltage slightly higher than the potential differences between the high power supply voltage VDD2H and the reference power supply voltage VGND and VDD2L and VGND. Then, the potential difference between the low power supply voltage VDD1H and VDD1L is set to be less than the low withstanding voltage of the element withstanding voltage VDD2T.

Specifically, because the section from the positive voltage signal supply circuit 10A to the node Ns11 is kept at a voltage in the range from the reference power supply voltage VGND to the positive high power supply voltage VDD2H, the amplifying circuit 10 and the switch 14 can be configured as transistors with the element withstanding voltage VDD2T. Likewise, because the section from the negative voltage signal supply circuit 20A to the node Ns21 is kept at a voltage in the range from the reference power supply voltage VGND to the negative high power supply voltage VDD2L, the amplifying circuit 20 and the switch 24 can be configured as transistors with the element withstanding voltage VDD2T.

The output selection switch 11 is controlled by the follower circuit 50 such that it is in the ON state when the positive voltage signal Vp is output to the output terminal DL1. As a result, voltages of each of the source and the drain of the output selection switch 11 are set to be within the positive voltage range from VGND to VDD2H. Furthermore, a voltage difference between the gate and the source of the output selection switch 11 is controlled by the follower circuit 50 such that it is within the element withstanding voltage VDD2T. On the other hand, when the negative voltage signal Vn is to be output to the output terminal DL1, the switches 12 and 13 performs control such that the reference power supply voltage VGND is supplied to the gate and the source of the output selection switch 11 and the output selection switch 11 is in the OFF state. Thus, even though the negative voltage signal Vn is output to the output terminal DL1 to which the drain of the output selection switch 11 is connected, voltages of the terminals including the source, drain, and gate of the output selection switch 11 are controlled such that they are within the element withstanding voltage VDD2T. Further, when a voltage to be output from the output terminal DL1 is switched from the positive voltage signal Vp to the negative voltage signal Vn, for example, control is performed such that the switch 13 is turned off with the switch 12 being on and the follower circuit 50 is caused to operate, and thus the output terminal DL1 is once driven with the reference power supply voltage VGND from the positive voltage. Then, the operation switches to an output operation of the negative voltage signal Vn. As a result, the voltage differences between the terminals of the output selection switch 11 can be kept within the element withstanding voltage VDD2T.

The output selection switch 21 is controlled by the follower circuit 60 such that it is in the ON state when the negative voltage signal Vn is output to the output terminal DL1. As a result, voltages of each of the source and the drain of the output selection switch 21 are set to be within the negative voltage range from VGND to VDD2L. Furthermore, a voltage difference between the gate and the source of the output selection switch 21 is controlled by the follower circuit 60 such that it is within the element withstanding voltage VDD2T. On the other hand, when the positive voltage signal Vp is output to the output terminal DL1, the switches 22 and 23 perform control such that the reference power supply voltage VGND is supplied to the gate and the source of the output selection switch 21 and the output selection switch 21 is in the OFF state. Thus, even though the positive voltage signal Vp is output to the output terminal DL1 to which the drain of the output selection switch 21 is connected, voltages of the source, drain, and gate of the output selection switch 21 are controlled such that they are within the element withstanding voltage VDD2T. Further, when a signal to be output from the output terminal DL1 is switched from the negative voltage signal Vn to the positive voltage signal Vp, for example, control is performed such that the switch 23 is turned off with the switch 22 being on and the follower circuit 60 is caused to operate, and thus the output terminal DL1 is once driven with the reference power supply voltage VGND from the negative voltage. Then, the operation switches to an output operation of the positive voltage signal Vp. As a result, the voltage difference between the terminals of the output selection switch 21 can be kept within the low element withstanding voltage VDD2T.

As described above, the output circuit 100 illustrated in FIG. 1 can be configured as a transistor having elements including the output selection switches 11 and 21 with the element withstanding voltage VDD2T.

Next, functions of the follower circuits 50 and 60 will be described with reference to FIGS. 2A and 2B.

Figure 2A:
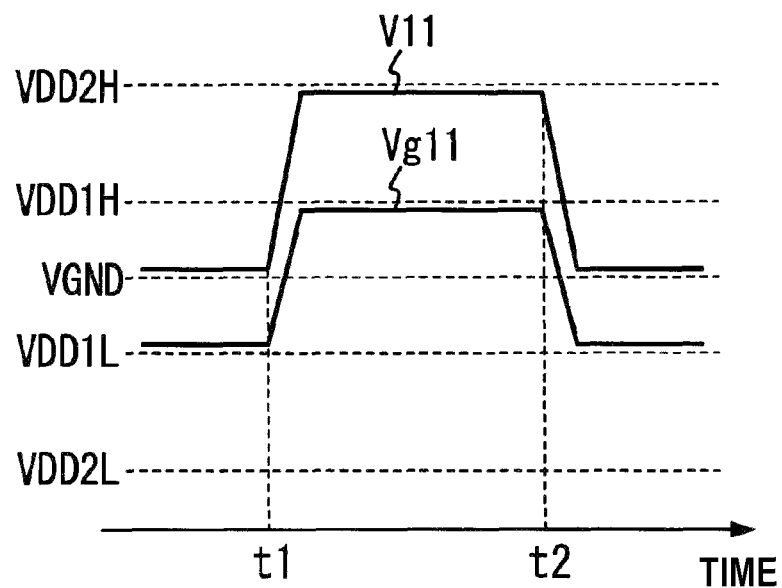
FIG. 2A is a waveform diagram illustrating a waveform of a voltage signal Vg11 generated by a follower circuit 50 following that of a positive voltage signal Vp (V11).

FIG. 2A illustrates the signal waveforms of the voltage signal V11 supplied to the source of the output selection switch 11 and the gate voltage Vg11 of the output selection switch 11 controlled by the follower circuit 50 when the positive voltage signal Vp is continuously output.

In the example illustrated in FIG. 2A, the voltage signal V11 has a waveform changing from a positive voltage close to the reference power supply voltage VGND to a positive voltage close to the positive high power supply voltage VDD2H at a time t1 and changing to a positive voltage close to the reference power supply voltage VGND again at a time t2.

The gate voltage Vg11 of the output selection switch 11 is subject to an in-phase follower operation within the voltage range from the negative low power supply voltage VDD1L to the positive low power supply voltage VDD1H while the voltage signal V11 changes in the voltage range from the reference power supply voltage VGND to the positive high power supply voltage VDD2H. Specifically, when the voltage signal V11 is on the positive high power supply voltage VDD2H side, the gate voltage Vg11 is controlled such that it is within the positive voltage range lower than or equal to the positive low power supply voltage VDD1H, and when the voltage signal V11 is on the reference power supply voltage VGND side, the gate voltage Vg11 is controlled such that it is within the negative voltage range higher than or equal to the negative low power supply voltage VDD1L. Thus, the voltage difference between the voltage signal V11 and the gate voltage Vg11 is within the threshold voltage (absolute value) of the output selection switch 11 and is controlled such that it is within the element withstanding voltage VDD2T.

Figure 2B:
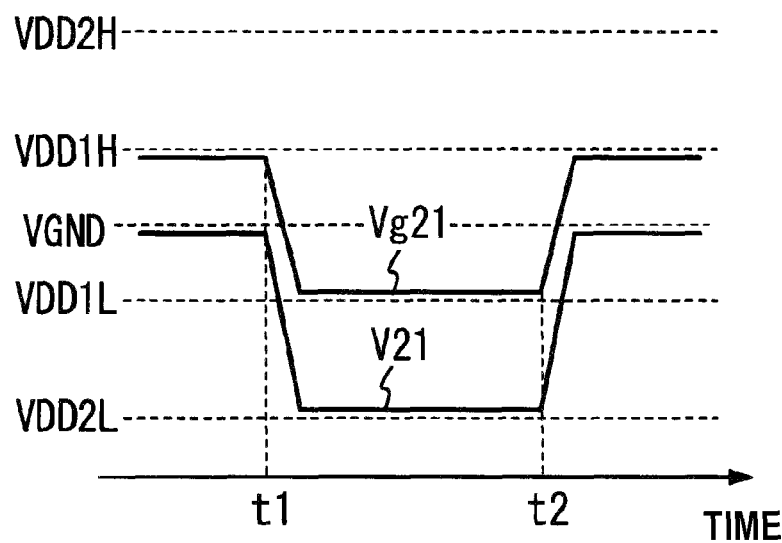
FIG. 2B is a timechart illustrating a waveform of a voltage signal Vg21 generated by a follower circuit 60 following that of a negative voltage signal Vn (V21).

FIG. 2B illustrates the signal waveforms of the voltage signal V21 supplied to the source of the output selection switch 21 and the gate voltage Vg21 of the output selection switch 21 controlled by the follower circuit 60 when the negative voltage signal Vn is continuously output in multiple periods.

In the example illustrated in FIG. 2B, the voltage signal V21 has a waveform changing from a negative voltage close to the reference power supply voltage VGND to a negative voltage close to the negative high power supply voltage VDD2L at a time t1 and changing to a negative voltage close to the reference power supply voltage VGND again at a time t2.

The gate voltage Vg21 of the output selection switch 21 is subject to an in-phase follower operation within the voltage range from the positive low power supply voltage VDD1H to the negative low power supply voltage VDD1L while the voltage signal V21 changes in the voltage range from the reference power supply voltage VGND to the negative high power supply voltage VDD2L. Specifically, when the voltage signal V21 is on the negative high power supply voltage VDD2L side, the gate voltage Vg21 is controlled such that it is within the negative voltage range equal to or higher than the negative low power supply voltage VDD1L, and when the voltage signal V21 is on the reference power supply voltage VGND side, the gate voltage Vg21 is controlled such that it is within the positive voltage range lower than or equal to the positive low power supply voltage VDD1H. Thus, the voltage difference between the voltage signal V21 and the gate voltage Vg21 is within the threshold voltage of the output selection switch 21 and is controlled such that it is within the element withstanding voltage VDD2T.

Further, in the following description, the expression "in-phase" of signal waveforms is used to mean a change of a voltage signal following that of another voltage signal. In other words, a temporary delay in a change of a voltage signal with respect to a change of another voltage signal or a slight difference in a voltage change amount is treated as in-phase.

In addition, although an example in which the gate voltage Vg11 is controlled within the voltage range between the power supply voltages VDD1L and VDD1H has been introduced in FIG. 2A, it can be controlled within the voltage range between the power supply voltages VDD1L and VGND or between the power supply voltages VDD2L and VGND as long as it is subject to the in-phase follower operation with the voltage signal V11 and configured to satisfy to be within the element withstanding voltage VDD2T.

Likewise, although an example in which the gate voltage Vg21 is controlled within the voltage range between the power supply voltages VDD1L and VDD1H has been introduced in FIG. 2B, it can be controlled within the voltage range between the power supply voltages VGND and VDD1H or between the power supply voltages VGND and VDD2H as long as it is subject to the in-phase follower operation with the voltage signal V21 and configured to satisfy to be within the element withstanding voltage VDD2T.

As described above in detail, the follower circuits 50 and 60 control the gate voltages of the output selection switches 11 and 21 according to a source follower operation following the voltages of the sources of the output selection switches 11 and 21. In other words, in the output circuit 100, control of the output selection switches (11 and 21) across voltage polarities is performed with simple circuits such as source follower circuits (50 and 60). Furthermore, the follower circuits 50 and 60 are configured with elements with low element withstanding voltage VDD2T or lower, the entire output circuit 100 of FIG. 1 can be configured with elements with element withstanding voltage VDD2T or lower, and as a result, a reduced area (cost reduction) of the circuits can be achieved.

In short, in the output circuit 100, the output selection switch 11 serving as a first switch receives the positive voltage signal V11 higher than the reference power supply voltage VGND via the node Ns11 and outputs the voltage signal V11 from the output terminal DL1 when the switch is in the ON state. Furthermore, the output selection switch 21 serving as a second switch receives the negative voltage signal V21 lower than the reference power supply voltage VGND via the node Ns21 and outputs the voltage signal V21 from the output terminal DL1 when the switch is in the ON state. At this time, the follower circuits 50 and 60 control the output selection switches 11 and 21 as follows. In other words, the follower circuit 50 generates an in-phase voltage signal following the voltage signal of the node Ns11 as the gate voltage Vg11 through the source follower operation and supplies the voltage signal to the gate Ng11 of the output selection switch 11. The follower circuit 60 generates an in-phase voltage signal following the voltage signal of the node Ns21 as the gate voltage Vg21 through the source follower operation and supplies the voltage signal to the gate Ng21 of the output selection switch 21. Furthermore, the output circuit 100 includes the switch 12 serving as a third switch to set the node Ns11 to the reference power supply voltage VGND when the switch 12 is in the ON state, the switch 22 serving as a fourth switch to set the node Ns21 to the reference power supply voltage VGND when the switch 22 is in the ON state, the switch 13 serving as a first control section to set the output selection switch 11 to be in the OFF state when the switch 13 is active (on), and the switch 23 serving as a second control section to set the output selection switch 21 to be in the OFF state when the switch 23 is active (on). In addition, when the positive voltage signal V11 is to be output from the output terminal DL1, the output selection switch 21 is set to be off and the node Ns21 is set to have the reference power supply voltage, and when the negative voltage signal V21 is to be output from the output terminal DL1, the output selection switch 11 is set to be off and the node Ns11 is set to have the reference power supply voltage.

With the above-described configuration, for each switch (11, 12, 14, and 51) that handles the positive voltage signal (Vp or V11) higher than the reference power supply voltage VGND and the negative voltage signal (Vn or V21) lower than the reference power supply voltage VGND, a transistor with a withstanding voltage that is about half of the voltage range from a minimum voltage (VDD2L) of the negative voltage signal to a maximum voltage (VDD2H) of the positive voltage signal can be used. Furthermore, simple source follower circuits such as the above-described follower circuits 50 and 60 can realize control across polarities over the gate voltages of the output selection switches 11 and 21 serving as an output selection switch.

Therefore, according to the output circuit 100 illustrated in FIG. 1, an output circuit that can selectively output one of a positive voltage and a negative voltage can have a reduced area in a simple configuration.

Further, the output circuit 100 illustrated in FIG. 1 and each example introduced below can be configured as P-channel and N-channel MOS transistor circuits that are formed on a semiconductor substrate such as a silicon substrate, or P-channel and N-channel thin film transistor circuits that are formed on an insulating substrate such as glass or plastic. Further, the back gate in a case in which the output circuit is configured as an MOS transistor can be set such that a voltage difference between the terminals including the gate, the drain, and the source is within the element withstanding voltage VDD2T.

Example 2

Figure 3:
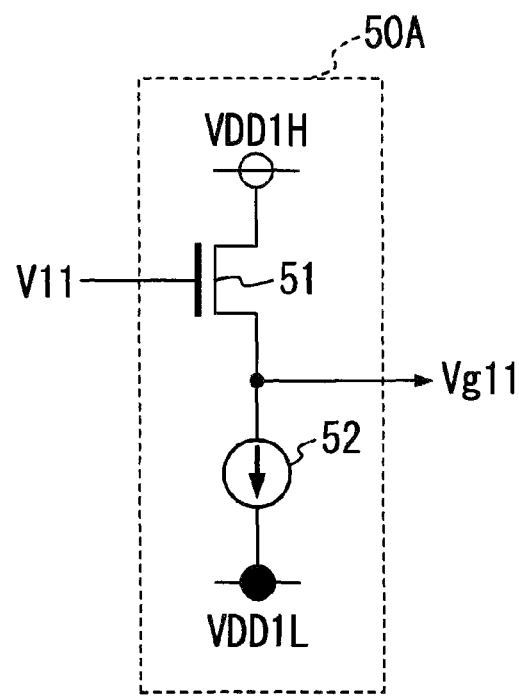
FIG. 3 is a circuit diagram illustrating a follower circuit 50A as an example of a specific circuit of a follower circuit 50.
Figure 4:
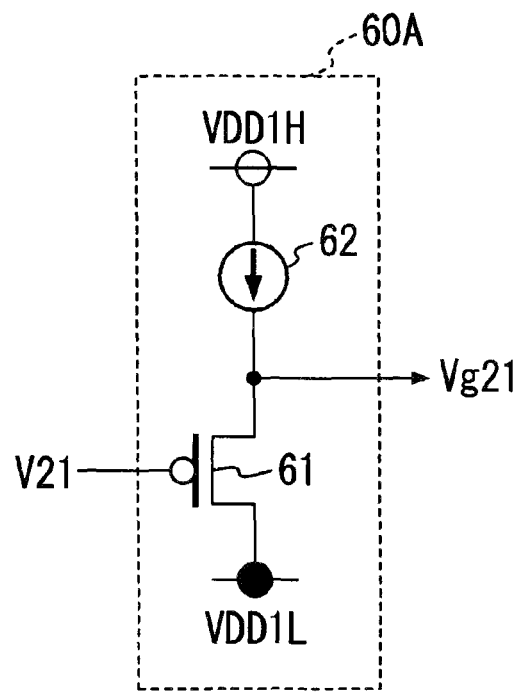
FIG. 4 is a circuit diagram illustrating a follower circuit 60A as an example of a specific circuit of a follower circuit 60.

FIGS. 3 and 4 are circuit diagrams illustrating follower circuits 50A and 60A as examples of the specific circuits of the follower circuits 50 and 60 of the output circuit 100 illustrated in FIG. 1. Further, the follower circuits 50A and 60A perform the operations illustrated in FIGS. 2A and 2B, respectively, like the follower circuits 50 and 60.

The follower circuit 50A illustrated in FIG. 3 includes an N-channel transistor 51 and the current source 52 cascade-connected between a positive low power supply voltage VDD1H and the negative low power supply voltage VDD1L.

The positive low power supply voltage VDD1H is applied to the drain of the N-channel transistor 51, and the voltage signal V11 is applied to the gate of the transistor. One end of the current source 52 receives application of the negative low power supply voltage VDD1L, and the other end is connected to the source of the N-channel transistor 51.

The follower circuit 50A performs a source follower operation in which an in-phase voltage signal with the lower voltage than the voltage signal V11 is output following the voltage signal V11 of the node Ns11 from the connection point of the source of the N-channel transistor 51 and the current source 52. The follower circuit 50A supplies the output voltage signal as a gate voltage Vg11 to the gate Ng11 of the output selection switch 11. Further, a voltage difference between the voltage signal V11 and the gate voltage Vg11 is set according to a current value of the current source 52, and controlled such that it is slightly higher than a threshold voltage of the N-channel transistor 51. As a result, both the N-channel transistor 51 and the current source 52 can operate at a voltage within the element withstanding voltage VDD2T.

The follower circuit 60A illustrated in FIG. 4 includes a current source 62 and a P-channel transistor 61 cascade-connected between the positive low power supply voltage VDD1H and the negative low power supply voltage VDD1L.

The negative low power supply voltage VDD1L is applied to the drain of the P-channel transistor 61, and the voltage signal V21 is applied to the gate of the transistor. One end of the current source 62 receives application of the positive low power supply voltage VDD1H, and the other end is connected to the source of the P-channel transistor 61.

The follower circuit 60A performs a source follower operation in which an in-phase voltage signal with the higher voltage than the voltage signal V21 is output following the voltage signal V21 of the node Ns21 from the connection point of the source of the P-channel transistor 61 and the current source 62. The follower circuit 60A supplies the output voltage signal as a gate voltage Vg21 to the gate Ng21 of the output selection switch 21. Further, a voltage difference between the voltage signal V21 and the gate voltage Vg21 is set according to a current value of the current source 62, and controlled such that it is slightly higher than a threshold voltage (absolute value) of the P-channel transistor 61. As a result, both the P-channel transistor 61 and the current source 62 can operate at a voltage within the element withstanding voltage VDD2T.

Example 3

Figure 5:
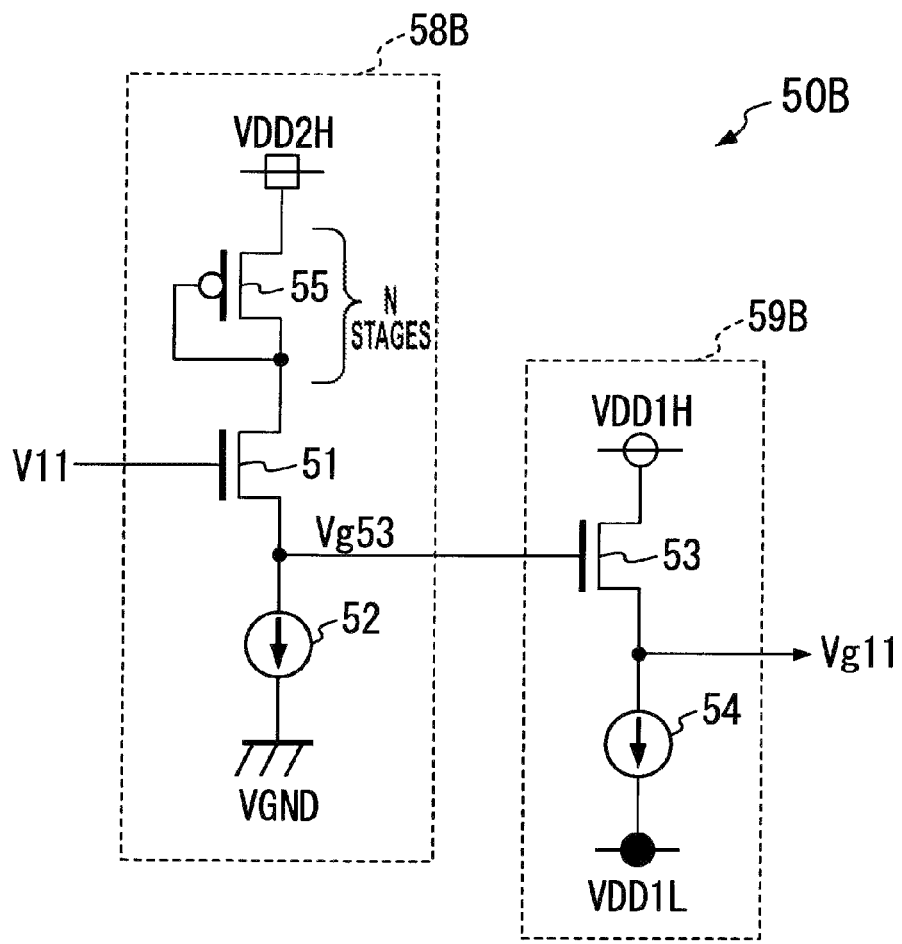
FIG. 5 is a circuit diagram illustrating a follower circuit 50B as another example of the specific circuit of the follower circuit 50.
Figure 6:
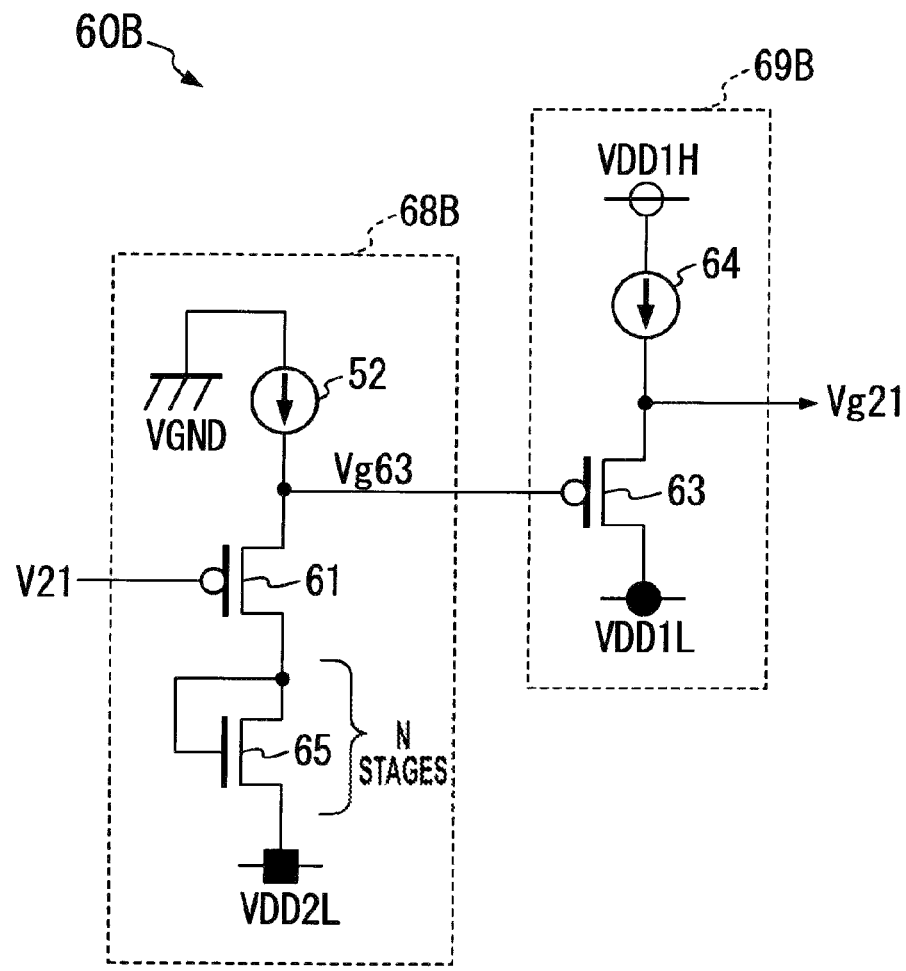
FIG. 6 is a circuit diagram illustrating a follower circuit 60B as another example of the specific circuit of the follower circuit 60.

FIGS. 5 and 6 are circuit diagrams illustrating follower circuits 50B and 60B as other examples of the specific circuits of the follower circuits 50 and 60 of the output circuit 100 illustrated in FIG. 1. Further, the follower circuits 50B and 60B perform the operations illustrated in FIGS. 2A and 2B, respectively, like the follower circuits 50 and 60.

The follower circuit 50B illustrated in FIG. 5 is constituted by sub-follower circuits 58B and 59B.

The sub-follower circuit 58B includes an N-channel transistor 51, a current source 52, and a clamp element 55 cascade-connected between the positive high power supply voltage VDD2H and the reference power supply voltage VGND.

The positive high power supply voltage VDD2H is applied to the drain of the N-channel transistor 51 via the clamp element 55, and the voltage signal V11 is applied to the gate of the transistor. One end of the current source 52 receives application of the reference power supply voltage VGND, and the other end is connected to the source of the N-channel transistor 51.

The sub-follower circuit 58B performs a source follower operation in which an in-phase voltage signal with the lower voltage than the voltage signal V11 is output as a voltage signal Vg53 following the voltage signal V11 of the node Ns11 from the connection point of the source of the N-channel transistor 51 and the current source 52.

The sub-follower circuit 59B includes an N-channel transistor 53 and a current source 54 cascade-connected between the positive low power supply voltage VDD1H and the negative low power supply voltage VDD1L.

The positive low power supply voltage VDD1H is applied to the drain of the N-channel transistor 53, and the voltage signal Vg53 output from the sub-follower circuit 58B is applied to the gate of the transistor. One end of the current source 54 receives application of the negative low power supply voltage VDD1L, and the other end is connected to the source of the N-channel transistor 53.

The sub-follower circuit 59B performs a source follower operation in which an in-phase voltage signal with the lower voltage than the voltage signal Vg53 is output as a gate voltage Vg11 following the voltage signal Vg53 from the connection point of the source of the N-channel transistor 53 and the current source 54. The sub-follower circuit 59B supplies the output gate voltage Vg11 to the gate Ng11 of the output selection switch 11.

In other words, the sub-follower circuit 58B outputs the voltage signal Vg53 through the source follower operation of the N-channel transistor 51 following the voltage signal V11, and the sub-follower circuit 59B outputs the gate voltage Vg11 through the source follower operation of the N-channel transistor 53 following the voltage signal Vg53. Thus, the gate voltage Vg11 is controlled as an in-phase signal with the lower voltage than the voltage signal V11 following the voltage signal V11. Further, a voltage difference between the voltage signal V11 and the voltage signal Vg53 is set according to a current value of the current source 52, and controlled such that it is slightly higher than a threshold voltage of the N-channel transistor 51. In addition, a voltage difference between the voltage signal Vg53 and the gate voltage Vg11 is set according to a current value of the current source 54, and controlled such that it is a voltage different slightly higher than the threshold voltage of the N-channel transistor 53.

However, the sub-follower circuit 58B illustrated in FIG. 5 includes the clamp element 55 that clamps an upper limit value of the voltage signal Vg53 such that the voltage difference between the gate and the source of the N-channel transistor 53 of the sub-follower circuit 59B is less than the element withstanding voltage VDD2T. The clamp element 55 is constituted by diode-connected transistors connected in series or in parallel in N (N≥1) stages or a resistive element and the like, and is connected between the positive high power supply voltage VDD2H and the drain of the N-channel transistor 51. Thus, the sub-follower circuits 58B and 59B can operate at a voltage within the element withstanding voltage VDD2T. Further, the sub-follower circuit 59B can receive power supply voltages of VGND and VDD1L, VGND and VDD2L, instead of VDD1H and VDD1L, as long as it has a voltage within the element withstanding voltage VDD2T.

In addition, although the follower circuit 50B is constituted by two circuits of the sub-follower circuits 58B and 59B in the one example illustrated in FIG. 5, it may be configured with three or more connected sub-follower circuits. By constituting the follower circuit 50B with sub-follower circuits in multiple stages, the voltage difference between the gate and the source of the output selection switch 11 can be expanded more, compared to the follower circuit 50A of FIG. 3. As a result, on-resistance of the output selection switch 11 decreases, and a drive capability of the positive voltage signal Vp is improved.

The follower circuit 60B illustrated in FIG. 6 is constituted by sub-follower circuits 68B and 69B.

The sub-follower circuit 68B includes a current source 52, a P-channel transistor 61, and a clamp element 65 cascade-connected between the reference power supply voltage VGND and the negative high power supply voltage VDD2L.

The negative high power supply voltage VDD2L is applied to the drain of the P-channel transistor 61 via the clamp element 65, and the voltage signal V21 is applied to the gate of the transistor. One end of the current source 52 receives application of the reference power supply voltage VGND, and the other end is connected to the source of the P-channel transistor 61.

The sub-follower circuit 68B performs a source follower operation in which a voltage signal with the higher voltage than the voltage signal V21 is output as a voltage signal Vg63 following the voltage signal V21 of the node Ns21 from the connection point of the source of the P-channel transistor 61 and the current source 52.

The sub-follower circuit 69B includes a P-channel transistor 63 and a current source 64 cascade-connected between the negative low power supply voltage VDD1L and the positive low power supply voltage VDD1H. The sub-follower circuit 69B performs a source follower operation in which an in-phase voltage signal with the higher voltage than the voltage signal Vg63 is output as a gate voltage Vg21 following the voltage signal Vg63 from the connection point of the source of the P-channel transistor 63 and the current source 64. The sub-follower circuit 69B supplies the output gate voltage Vg21 to the gate Ng21 of the output selection switch 21.

In other words, the sub-follower circuit 68B outputs the voltage signal Vg63 through the source follower operation of the P-channel transistor 61 following the voltage signal V21, and the sub-follower circuit 69B outputs the gate voltage Vg21 through the source follower operation of the P-channel transistor 63 following the voltage signal Vg63. Thus, the gate voltage Vg21 is controlled as an in-phase signal on the higher voltage side following the voltage signal V21. Further, a voltage difference between the voltage signal V21 and the voltage signal Vg63 is set according to a current value of the current source 62, and controlled such that it is slightly higher than a threshold voltage (absolute value) of the P-channel transistor 61. Further, a voltage difference between the voltage signal Vg63 and the gate voltage Vg21 is set according to a current value of the current source 64, and controlled such that it is slightly higher than a threshold voltage (absolute value) of the P-channel transistor 63.

Further, the sub-follower circuit 68B illustrated in FIG. 6 includes the clamp element 65 that clamps a lower limit value of the voltage signal Vg63 such that the voltage difference between the gate and the source of the P-channel transistor 63 of the sub-follower circuit 69B is less than the element withstanding voltage VDD2T. The clamp element 65 is constituted by diode-connected transistors connected in series or in parallel in N (N≥1) stages or a resistive element and the like, and is connected between the negative high power supply voltage VDD2L and the drain of the P-channel transistor 61. Thus, the sub-follower circuits 68B and 69B can operate at a voltage within the element withstanding voltage VDD2T. Further, the sub-follower circuit 69B can receive power supply voltages of VGND and VDD1L, VGND and VDD2H, instead of VDD1H and VDD1L, as long as it has a voltage within the element withstanding voltage VDD2T.

In addition, although the follower circuit 60B is constituted by two circuits of the sub-follower circuits 68B and 69B in the one example illustrated in FIG. 6, it may be configured with three or more connected sub-follower circuits. By constituting the follower circuit 60B with sub-follower circuits in multiple stages, the voltage difference between the gate and the source of the output selection switch 21 can be expanded more, compared to the follower circuit 60A of FIG. 4. As a result, on-resistance of the output selection switch 21 decreases, and a drive capability of the negative voltage signal Vn is improved.

Next, functions of the follower circuits 50B and 60B of FIGS. 5 and 6 will be described with reference to FIGS. 7A and 7B.

Figure 7A:
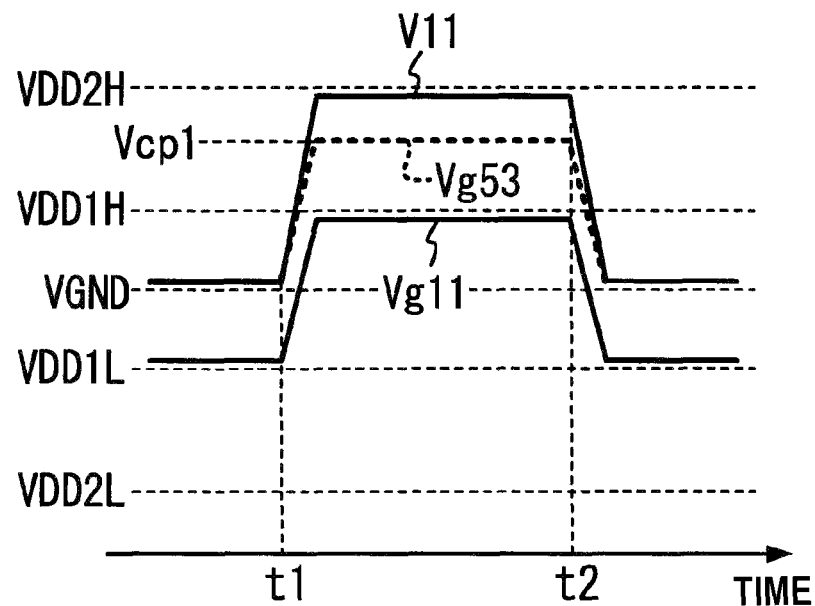
FIG. 7A is a waveform diagram illustrating a waveform of a voltage signal Vg11 generated by the follower circuit 50B following that of the positive voltage signal Vp (V11).

FIG. 7A illustrates signal waveforms of the voltage signal V11, voltage signal Vg53, and gate voltage Vg11 of the follower circuit 50B illustrated in FIG. 5. The voltage signal V11 and the gate voltage Vg11 are the same as those in FIG.

2A. The voltage signal Vg53 is a voltage resulting from converting the voltage signal V11 into a voltage signal in the voltage range between the reference power supply voltage VGND and a voltage Vcp1 by the sub-follower circuit 58B of the follower circuit 50B. The voltage Vcp1 is set by the clamp element 55 of the follower circuit 50B. In other words, the follower circuit 50B illustrated in FIG. 5 converts the voltage signal V11 into a voltage signal shifted 2 levels to the lower voltage side (the gate voltage Vg11).

Further, although the voltage signal V11 and the gate voltage Vg11 are illustrated in the same waveform in FIGS. 2A and 7A to schematically show the functions, the configuration of the follower circuit 50B of FIG. 5 constituted by the multiple sub-follower circuits can expand the voltage difference between the voltage signal V11 and the gate voltage Vg11 more.

Figure 7B:
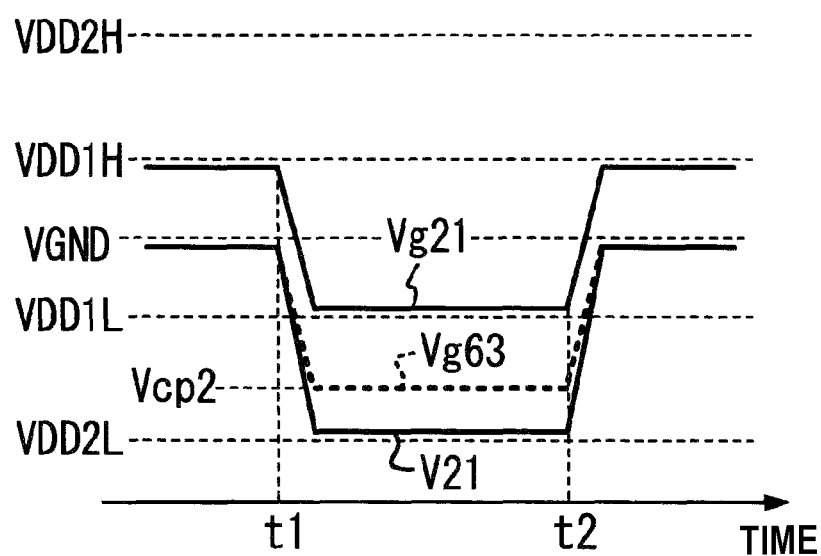
FIG. 7B is a timechart illustrating a waveform of a voltage signal Vg21 generated by the follower circuit 60B following that of the negative voltage signal Vn (V21).

FIG. 7B illustrates signal waveforms of the voltage signal V21, voltage signal Vg63, and gate voltage Vg21 of the follower circuit 60B illustrated in FIG. 6. The voltage signal V21 and the gate voltage Vg21 are the same as those in FIG. 2B. The voltage signal Vg63 is a voltage resulting from converting the voltage signal V21 into a voltage signal in the voltage range between the reference power supply voltage VGND and a voltage Vcp2 by the sub-follower circuit 68B of the follower circuit 60B. The voltage Vcp2 is set by the clamp element 65 of the follower circuit 60B. In other words, the follower circuit 60B illustrated in FIG. 6 converts the voltage signal V21 into a voltage signal shifted 2 levels to the higher voltage side (the gate voltage Vg21).

Further, although the voltage signal V21 and the gate voltage Vg21 are illustrated in the same waveform in FIGS. 2B and 7B to schematically show the functions, the configuration of the follower circuit 60B of FIG. 6 constituted by the multiple sub-follower circuits can expand the voltage difference between the voltage signal V21 and the gate voltage Vg21 more.

Example 4

Figure 8:
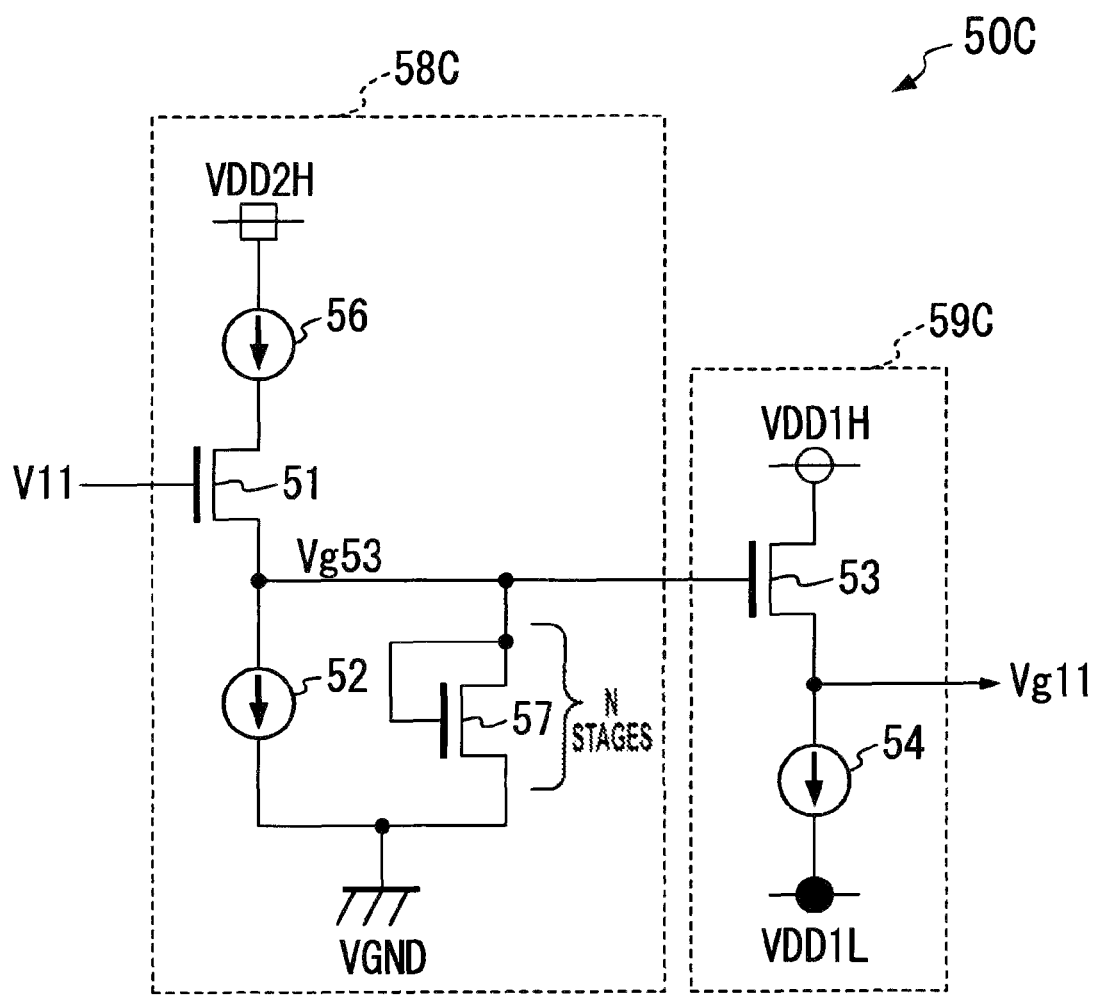
FIG. 8 is a circuit diagram illustrating a follower circuit 50C as another example of the specific circuit of the follower circuit 50.

FIG. 8 is circuit diagrams illustrating a follower circuits 50C as another example of the specific circuit of the follower circuit 50 of the output circuit 100 illustrated in FIG. 1. Further, the follower circuit 50C performs the operation illustrated in FIG. 7A, like the follower circuit 50B illustrated in FIG. 5.

The follower circuit 50C illustrated in FIG. 8 is constituted by sub-follower circuits 58C and 59C.

The sub-follower circuit 58C has a configuration in which the clamp element 55 of the sub-follower circuit 58B illustrated in FIG. 5 is replaced with a current source 56 and a clamp element 57 is added between the source of the N-channel transistor 51 and the reference power supply voltage VGND. The sub-follower circuit 59C has the same configuration as the sub-follower circuit 59B illustrated in FIG. 5.

A current value of the current source 56 of the sub-follower circuit 58C is set equivalent to a current value of the current source 52. Thus, the voltage signal Vg53 quickly follows a change of the voltage signal V11. The clamp element 57 is constituted by diode-connected transistors connected in series or in parallel in N (N≥1) stages or by a resistive element, and the like. The clamp element 57 clamps an upper limit value of the output voltage signal Vg53 of the sub-follower circuit 58C so that the voltage difference between the gate and the source of the N-channel transistor 53 of the sub-follower circuit 59C is less than the element withstanding voltage VDD2T. Further, other operations of the follower circuit 50C are similar to those of the follower circuit 50B illustrated in FIG. 5. Therefore, the sub-follower circuits 58C and 59C can operate at a voltage within the element withstanding voltage VDD2T.

In addition, the follower circuit 50C illustrated in FIG. 8 is constituted by the sub-follower circuits in multiple stages, similar to the follower circuit 50B illustrated in FIG. 5, causes the output selection switch 11 to operate with low on-resistance, and thus a drive capability of the positive voltage signal Vp can be increased.

Further, the follower circuit 60 illustrated in FIG. 1 can be subject to changes similar to those of the follower circuit 50 in FIGS. 5 to 8.

Example 5

Figure 9:
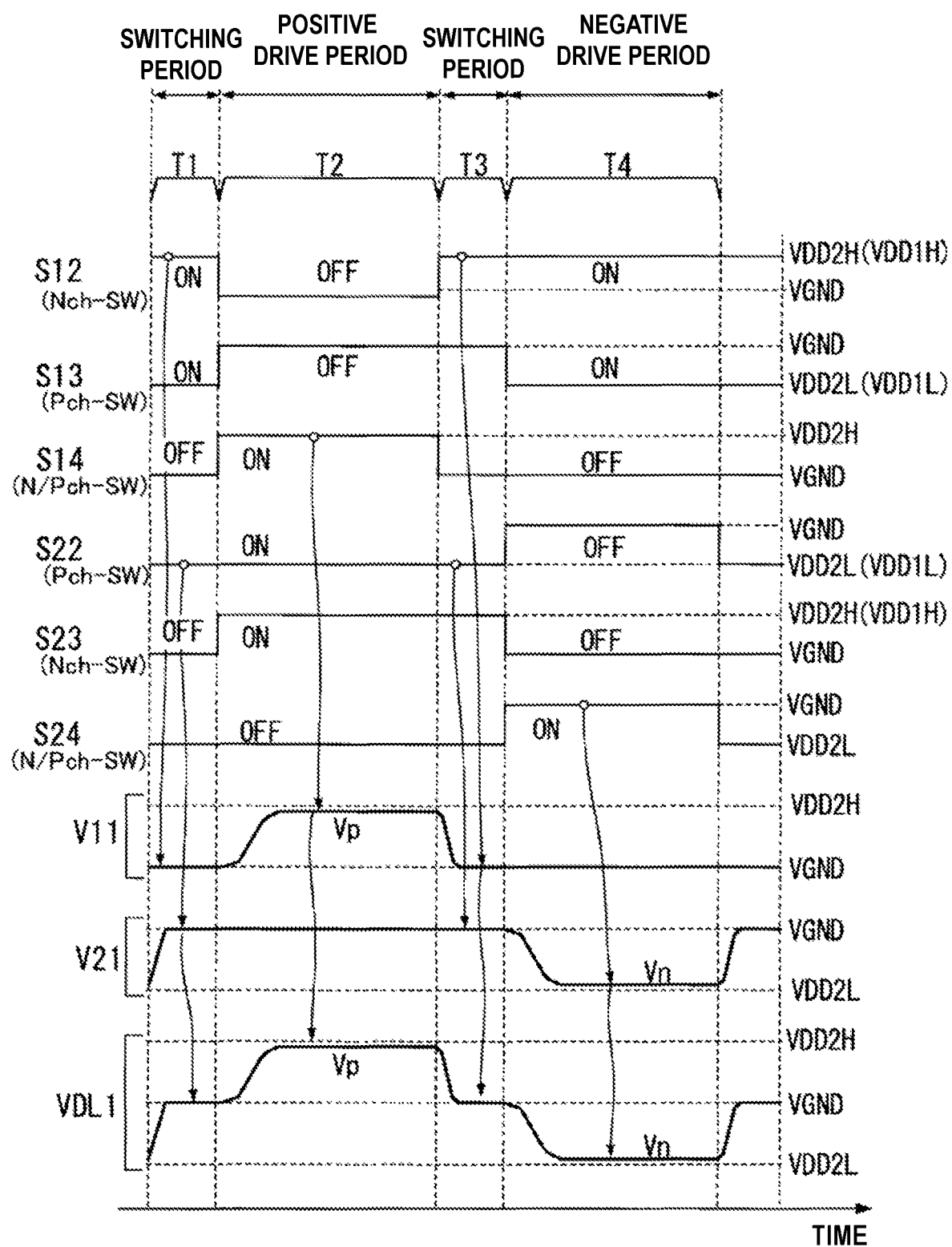
FIG. 9 is a timechart illustrating an example of an internal operation of the output circuit 100.

FIG. 9 is a timechart showing an example of the control signals S12 to S14 and S22 to S24 generated by the control part 101 of FIG. 1 when the output circuit 100 periodically switches between the positive voltage signal Vp and the negative voltage signal Vn and outputs the signal in an alternate manner, in other words, when so-called polarity inversion driving is performed. Furthermore, FIG. 9 illustrates voltage waveforms of the voltage signal V11 of the node Ns11, the voltage signal V21 of the node Ns21, and an output voltage VDL1 of the output terminal DL1 generated by control of turning on and off the switches 12 to 14 and 22 to 24 using the control signals S12 to S14 and S22 to S24.

Further, the switches 12 and 23 that receive the control signals S12 and S23 respectively are configured as N-channel transistors, and the switches 13 and 22 that receive the control signals S13 and S22 respectively are configured as P-channel transistors, In addition, the switches 14 and 24 that receive the control signals S14 and S24 respectively are assumed to be complementary transistor switches, which receive the control signals S14 and S24 at the gates of the N-channel transistors' side. It is assumed that a power supply voltage is supplied according to the voltage polarities of the switches controlled with the control signals S12, S13, S14, S22, S23 and S24 for controlling the switches.

The control part 101 performs control of turning on and off of the switches 12 to 14 and 22 to 24 with the control signals S12 to S14 and S22 to S24 illustrated in FIG. 9 at each of a positive drive period T2 at which the positive voltage signal Vp is output, a negative drive period T4 at which the negative voltage signal Vn, and switching periods T1 and T3. As a result, the voltage signal V11 is generated in the node Ns11, the voltage signal V21 is generated in the node Ns21, and the output voltage VDL1 is output through the output terminal DL1 in each of the switching periods T1 and T3, the positive drive period T2, and the negative drive period T4 as illustrated in FIG. 9. Further, the positive voltage signal Vp and the negative voltage signal Vn may be single- or multiple-step signals within a voltage range corresponding to their polarities. In addition, the positive drive period T2 and the negative drive period T4 may be divided into multiple periods in which multiple voltage signals with the same polarity are sequentially output.

Here, the switching periods T1 and T3 in which the output terminal DL1 is temporarily driven in the state of the reference power supply voltage VGND to prevent the withstanding voltage of each switch from exceeding are provided between the positive drive period T2 and the negative drive period T4 as illustrated in FIG. 9. Further, it is assumed that the state immediately before the switching period T1 (initial state) is the state in which the negative voltage signal Vn generated by the negative voltage signal supply circuit 20A is supplied to the output terminal DL1 via the output selection switch 21, that is, the operation state in the negative drive period T4.

In FIG. 9, first in the switching period T1, the switches 14 and 24 are caused to be in the OFF state together due to the control signals S14 and S24, and thus the supply of the voltage signals from the positive voltage signal supply circuit 10A and the negative voltage signal supply circuit 20A to the nodes Ns11 and Ns21 is cut off. In addition, the switches 12 and 13 are caused to be in the ON state together due to the control signals S12 and S13, and thus the reference power supply voltage VGND is supplied to the gate and the source (the node Ns11) of the output selection switch (P-channel transistor switch) 11. As a result, the voltage signal V11 of the node Ns11 is converted into the reference power supply voltage VGND and the follower circuit 50 gets into an inactive state, and thus the output selection switch 11 gets into the OFF state. In addition, the switch 22 is caused to be in the ON state due to the control signal S22, and thus the reference power supply voltage VGND is supplied to the source (the node Ns21) of the output selection switch (N-channel transistor switch) 21.

Furthermore, because the switch 23 is caused to be in the OFF state due to the control signal S23 at the switching period T1, the output selection switch 21 is caused to be in the ON state due to the follower circuit 60. As a result, the voltage signal V21 of the node Ns21 is raised to the reference power supply voltage VGND, and the output voltage VDL1 of the output terminal DL1 is raised to the reference power supply voltage VGND via the output selection switch 21.

Next, in the positive drive period T2, the switches 22 and 23 are caused to be in the ON state together due to the control signals S22 and S23, and thus the reference power supply voltage VGND is supplied to the gate and the source (the node Ns21) of the output selection switch (N-channel transistor) 21. As a result, the voltage signal V21 of the node Ns21 is converted into the reference power supply voltage VGND and the follower circuit 60 gets into an inactive state, and thus the output selection switch 21 gets into the OFF state. In addition, the switches 12 and 13 are caused to be in the OFF state together due to the control signals S12 and S13, the follower circuit 50 causes the output selection switch 11 to be in the ON state.

Furthermore, in the positive drive period T2, the switch 24 is caused to be in the OFF state due to the control signal S24, and the supply of the voltage signal from the negative voltage signal supply circuit 20A is continuously cut off. On the other hand, the switch 14 is caused to be in the ON state due to the control signal S14, and the positive voltage signal Vp (V11) is supplied from the positive voltage signal supply circuit 10A to the node Ns11. In addition, the output voltage VDL1 of the output terminal DL1 is raised to the positive voltage signal Vp via the output selection switch 11 being in the ON state. Further, in the positive drive period T2, the follower circuit 50 keeps the ON state of the output selection switch 11 even if the voltage of the positive voltage signal Vp output from the positive voltage signal supply circuit 10A is changed. Therefore, the output voltage VDL1 also changes following the voltage of the positive voltage signal Vp.

Next, in the switching period T3, the switches 14 and 24 are caused to be in the OFF state together due to the control signals S14 and S24, and thus the supply of the voltage signals from the positive voltage signal supply circuit 10A and the negative voltage signal supply circuit 20A is cut off. In addition, because the switches 22 and 23 are continuously in the ON state together due to the control signals S22 and S23, the voltage signal V21 of the node Ns21 is kept at the reference power supply voltage VGND, and the follower circuit 60 is kept in the inactive state as well. As a result, the output selection switch 21 is kept in the OFF state.

Furthermore, in the switching period T3, the switch 12 is caused to be in the ON state due to the control signal S12, and thus the reference power supply voltage VGND is supplied to the source (node Ns11) of the output selection switch (P-channel transistor switch) 11. In addition, the switch 13 is continuously in the OFF state due to the control signal S13, and the output selection switch 11 is kept in the ON state due to the follower circuit 50. As a result, the voltage signal V11 of the node Ns11 is reduced to the reference power supply voltage VGND, and the output voltage VDL1 of the output terminal DL1 is reduced to the reference power supply voltage VGND via the output selection switch 11.

Next, in the negative drive period T4, the switches 12 and 13 are caused to be in the ON state together due to the control signals S12 and S13, and thus the reference power supply voltage VGND is supplied to the gate and the source (node Ns11) of the output selection switch (P-channel transistor) 11. As a result, the voltage signal V11 of the node Ns11 comes to have the reference power supply voltage VGND. In addition, the switches 22 and 23 are caused to be in the OFF state together due to the control signals S22 and S23, and the follower circuit 60 causes the output selection switch 21 to be in the ON state.

Furthermore, in the negative drive period T4, the switch 14 is caused to be in the OFF state due to the control signal S14, and the supply of the voltage signal from the positive voltage signal supply circuit 10A is continuously cut off. On the other hand, the switch 24 is caused to be in the ON state due to the control signal S24, and the negative voltage signal Vn (V21) is supplied from the negative voltage signal supply circuit 20A to the node Ns21. In addition, the output voltage VDL1 of the output terminal DL1 is reduced to the negative voltage signal Vn via the output selection switch 21 being in the ON state. Further, in the negative drive period T4, the follower circuit 60 keeps the ON state of the output selection switch 21 even if the voltage of the negative voltage signal output from the negative voltage signal supply circuit 20A is changed. Therefore, the output voltage VDL1 also changes following the voltage of the negative voltage signal Vn.

However, because one of the follower circuits 50 and 60 is in the inactive state in the switching periods T1 and T3, the follower circuits 50 and 60 may adopt a configuration including a switch that temporarily cuts off a current from the current source when the circuits are in the inactive state.

In addition, although the control example in which the positive drive period and the negative drive period are alternately switched has been described, the control is performed according to a rise or fall of a power supply voltage when power is turned on or off. When the power supply voltage is raised or falls, for example, a capacitive load connected to the output terminal DL1 is driven at the reference power supply voltage, and thus the supply of the voltage signals from the positive voltage signal supply circuit 10A and the negative voltage signal supply circuit 20A is cut off. In other words, the control part 101 performs control such that the switches 14 and 24 are in the OFF state, the switches 12 and 22 are in the ON state, and the switches 13 and 23 are in the OFF state. Furthermore, control may be performed such that the follower circuits 50 and 60 are in the active state together, and the output selection switches 11 and 21 are turned on together.

Example 6

Figure 10:
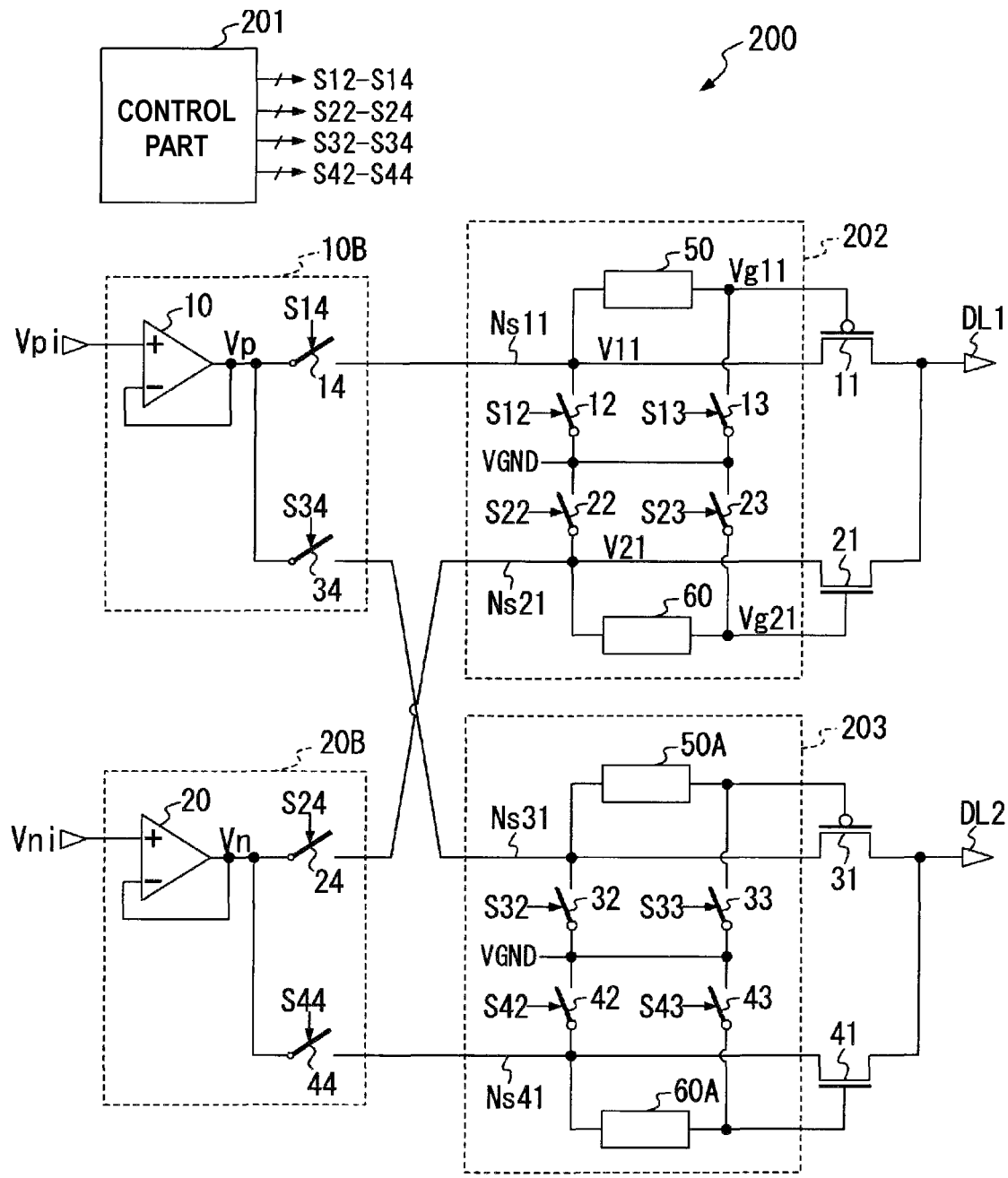
FIG. 10 is a circuit diagram illustrating a configuration of an output circuit 200 as another example of the output circuit according to the present disclosure.

FIG. 10 is a circuit diagram illustrating a configuration of an output circuit 200 as another example of the output circuit according to the present disclosure.

While the output circuit 100 alternately outputs a positive voltage signal and a negative voltage signal to one system of the load, the output circuit 200 illustrated in FIG. 10 outputs a positive voltage signal to one of two systems of loads and a negative voltage signal to the other and performs polarity inversion driving of alternately switching the polarity of the signals.

Further, in the output circuit 200 illustrated in FIG. 10, a positive voltage signal supply circuit 10B is employed in place of the positive voltage signal supply circuit 10A illustrated in FIG. 1, a negative voltage signal supply circuit 20B is employed in place of the negative voltage signal supply circuit 20A, and a control part 201 is employed in place of the control part 101. Furthermore, in the output circuit 200 illustrated in FIG. 10, an output terminal DL2, switches 32, 33, 34, 42, 43, and 44, output selection switches 31 and 41, and follower circuits 50A and 60A are newly provided, and other configurations are the same as those illustrated in FIG. 1.

In FIG. 10, the positive voltage signal supply circuit 10B controls supply of a positive voltage signal Vp (VGND<Vp<VDD2H) to a node Ns11 or Ns31 of the two systems and cut-off of the supply. The negative voltage signal supply circuit 20B controls supply of a negative voltage signal Vn (VGND>Vn>VDD2L) to a node Ns21 or Ns41 of the two systems and cut-off of the supply.

An output selection switch 31 is configured as a P-channel transistor having the source connected to the node Ns31 and the drain connected to the output terminal DL2. An output selection switch 41 is configured as an N-channel transistor having the source connected to the node Ns41 and the drain connected to the output terminal DL2.

The follower circuit 50A is connected between the gate and the source of the output selection switch (P-channel transistor switch) 31 and has the same functions as the follower circuit 50. The follower circuit 60A is connected between the gate and the source of the output selection switch (N-channel transistor switch) 41 and has the same functions as the follower circuit 60.

The switch 32 is configured as an N-channel transistor connected between the node Ns31 and a reference power supply terminal from which the reference power supply voltage VGND is supplied. The switch 42 is configured as a P-channel transistor connected between the node Ns41 and the reference power supply terminal. The switch 33 is configured as a P-channel transistor connected between the gate of the output selection switch (P-channel transistor) 31 and the reference power supply terminal. The switch 43 is configured as an N-channel transistor connected between the gate of the output selection switch (N-channel transistor) 41 and the reference power supply terminal. Further, the switch 33 can be replaced with a switch connecting the gate of the output selection switch 31 and the node Ns31, and the switch 43 can be replaced with a switch connecting the gate of the output selection switch 41 and the node Ns41.

As illustrated in FIG. 10, a circuit 202 configured from the nodes Ns11 and Ns21 to the output terminal DL1 and a circuit 203 configured from the nodes Ns31 and Ns41 to the output terminal DL2 have the same function as each other, and when one of the circuits performs an operation of outputting a positive voltage signal, the other performs an operation of outputting a negative voltage signal.

The positive voltage signal supply circuit 10B illustrated in FIG. 10 has a configuration in which the switch 34 that controls supply of the positive voltage signal Vp to the node Ns31 and cut-off of the supply is added to the positive voltage signal supply circuit 10A illustrated in FIG. 1. Because the switch 34 also allows the positive voltage signal Vp in a wide voltage range to pass therethrough, it is configured as a complementary switch like the switch 14. Further, an amplifying circuit 10 included in the positive voltage signal supply circuit 10B may be configured to include the functions of the switches 14 and 34.

The negative voltage signal supply circuit 20B has a configuration in which the switch 44 that controls supply of the negative voltage signal Vn to the node Ns41 and cut-off of the supply is added to the negative voltage signal supply circuit 20A illustrated in FIG. 1. Because the switch 44 also allows the negative voltage signal Vn in a wide voltage range to pass therethrough, it is configured as a complementary switch like the switch 24. Further, an amplifying circuit 20 included in the negative voltage signal supply circuit 20B may be configured to include the functions of the switches 24 and 44.

When the positive voltage signal Vp is output to the output terminal DL1 in the output circuit 200 illustrated in FIG. 10, each of the switches 12 to 14 and 22 to 24 for controlling output to the output terminal DL1 is controlled such that it is turned on and off as in the positive drive period T2 of FIG. 9 (including the switching periods before and after the period). Furthermore, at this time, each of the switches 32 to 34 and 42 to 44 for controlling output to the output terminal DL2 is controlled similarly to the control over the switches 12 to 14 and 22 to 24 in the negative drive period T4 of FIG. 9 (including the switching periods before and after the period), and thus the negative voltage signal Vn is output to the output terminal DL2.

On the other hand, when the negative voltage signal Vn is output to the output terminal DL1, a control part 201 performs control such that each of the switches 12 to 14 and 22 to 24 for controlling output to the output terminal DL1 is turned on and off as in the negative drive period T4 of FIG. 9 (including the switching periods before and after the period). Furthermore, at this time, the control part 201 performs control such that each of the switches 32 to 34 and 42 to 44 for controlling output to the output terminal DL2 is turned on and off similarly to the control over the switches 12 to 14 and 22 to 24 in the positive drive period T2 of FIG. 9 (including the switching periods before and after the period), and thus the positive voltage signal Vp is output to the output terminal DL2.

In other words, the control part 201 generates control signals S32 to S34 and S42 to S44 for controlling the switches 32 to 34 and 42 to 44 as described above, together with the control signals S11 to S13 and S22 to S24 at the timings shown in FIG. 9, like the control part 101 illustrated in FIG. 1. Further, in a case in which each of the switches 14, 24, 34, and 44 is configured as a complementary switch, complementary signals to be supplied to switches 14, 24, 34 and 44 are generated by the control part 201 as well.

As described above in detail, the drive control illustrated in FIG. 9 is performed also on the output circuit 200 illustrated in FIG. 10 in the same manner as in the output circuit 100. However, with respect to the drive control applied to the output terminal DL2, the supply period of the positive voltage signal Vp is switched with the supply period of the negative voltage signal Vn. In other words, the negative voltage signal Vn is supplied to the output terminal DL2 when the positive voltage signal Vp is supplied to the output terminal DL1, and the positive voltage signal Vp is supplied to the output terminal DL2 when the negative voltage signal Vn is supplied to the output terminal DL1. Further, because elements of the output circuit 200 illustrated in FIG. 10 can be configured as low-withstanding voltage elements like those of the output circuit 100, a reduced area and cost of the output circuit can be achieved.

Example 7

Figure 11:
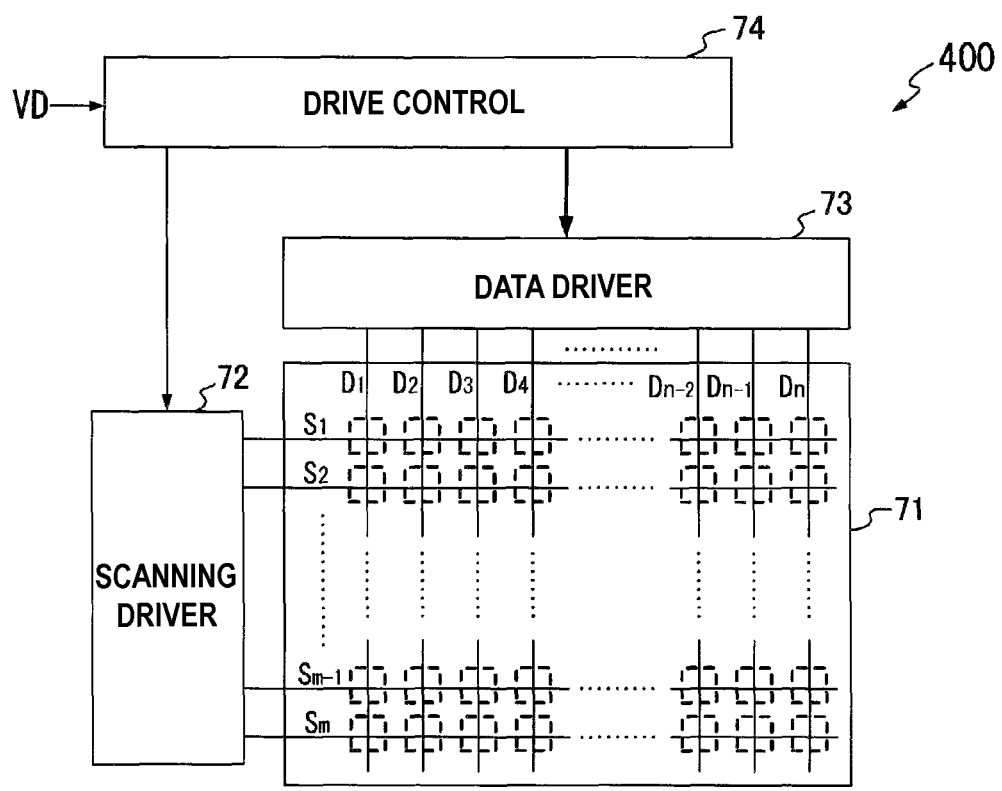
FIG. 11 is a block diagram illustrating a configuration of a display apparatus 400 with a data driver 73 including the output circuit according to the present disclosure.

FIG. 11 is a block diagram illustrating a schematic configuration of a liquid crystal display apparatus 400 with a data driver 73 including an output circuit according to the present disclosure.

In FIG. 11, m (m is an integer equal to or greater than 2) horizontal scanning lines S1 to Sm extending in the horizontal direction of a two-dimensional screen and n (n is an integer equal to or greater than 2) data lines D1 to Dn extending in the vertical direction on the two-dimensional screen are formed on an active matrix display panel 71 including liquid crystal display devices in units of pixels. Display cells serving as pixels are formed at each intersection of the horizontal scanning lines and data lines. The display cells include at least switching elements and pixel electrodes, and when the switching elements are in the ON state according to a scanning pulse of the horizontal scanning lines, a gradation voltage signal of the data lines is applied to the pixel electrodes via the switching elements, and thereby luminance of each pixel is controlled according to the gradation voltage applied to the pixel electrodes. Further, in FIG. 11, a detailed configuration of the display cells is omitted.

A drive control part 74 receives a video signal VD integrated with a control signal, and the like, generates a timing signal based on a horizontal synchronization signal from the video signal VD, and supplies the timing signal to a scanning driver 72. In addition, the drive control part 74 generates a group of various control signals based on the video signal VD and a system of pixel data PD indicating a luminance level of each pixel with, for example, an 8-bit luminance gradation, and supplies them to the data driver 73.

The scanning driver 72 sequentially applies horizontal scanning pulses to each of the horizontal scanning lines S1 to Sm of the display panel 71 based on the timing signals supplied from the drive control part 74.

The data driver 73 is formed in a semiconductor device, for example, a large-scale integrated circuit (LSI). The data driver 73 converts the pixel data PD supplied from the drive control part 74 into gradation voltage signals G1 to Gn having a gradation voltage according to each piece of the pixel data PD for one horizontal scanning line, that is, for every n lines. Then, the data driver 73 applies the gradation voltage signals G1 to Gn to the data lines D1 to Dn of the display panel 71.

Further, the scanning driver 72 or the data driver 73 may be formed to be partly or entirely integrated with the display panel 71. In addition, the data driver 73 may be configured with multiple LSIs.

Figure 12:
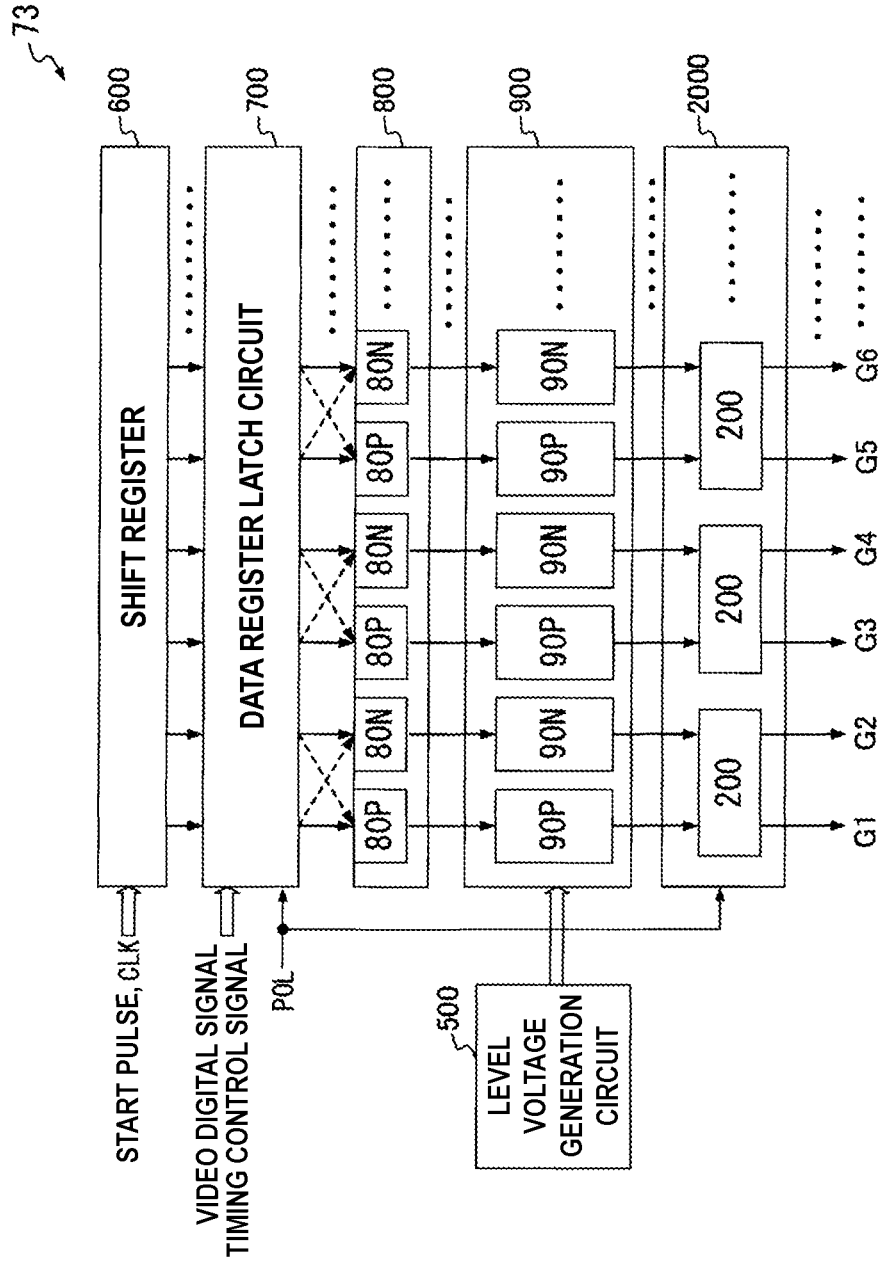
FIG. 12 is a block diagram illustrating an internal configuration of the data driver 73.

FIG. 12 is a block diagram illustrating an internal configuration of the data driver 73.

The data driver 73 includes a shift register 600, a data register latch circuit 700, a level shifter circuit 800, a level voltage generation circuit 500, a decoder circuit 900, and an output amplifying circuit 2000 as illustrated in FIG. 12.

In addition, the data driver 73 also includes an interface circuit (not illustrated) that receives a control signal and a video digital signal supplied from the drive control part 74 illustrated in FIG. 11 to generate a necessary clock signal and a control signal in the driver and outputs a group of various signals that have been synchronized with the video digital signals. Details of the interface circuit will be omitted in FIG. 12 for convenience of explanation.

Further, for power supply voltages, at least the reference power supply voltage VGND and the positive low power supply voltage VCC1H are supplied to the shift register 600 and the data register latch circuit 700, and the negative low power supply voltage VDD1L is also supplied to the block that generates a negative-side signal.

At least the reference power supply voltage VGND, the positive high power supply voltage VDD2H, and the negative high power supply voltage VDD2L are supplied to the level shifter circuit 800, the level voltage generation circuit 500, and the decoder circuit 900 as power supply voltages. The reference power supply voltage VGND, the positive low power supply voltage VDD1H, the negative low power supply voltage VDD1L, the positive high power supply voltage VDD2H, and the negative high power supply voltage VDD2L are supplied to the output amplifying circuit 2000 as power supply voltages.

The shift register 600 generates multiple latch timing signals for selecting a latch in synchronization with a clock signal CLK according to a start pulse and supplies the latch timing signals to the data register latch circuit 700.

The data register latch circuit 700 receives video digital signals, polarity inversion signals POL, and timing control signals, extracts the video digital signals by a predetermined numbers based on each of the latch timing signals supplied from the shift register 600, and supplies the predetermined number of video digital signals to the level shifter circuit 800 at latch timings.

Further, the data register latch circuit 700 selects video digital signals and output them to level shifters 80P or 80N corresponding to whether the signals are positive or negative based on the polarity inversion signals POL.

The level shifter circuit 800 includes positive level shifters 80P and negative level shifters 80N. The positive level shifters 80P convert low-amplitude (VGND to VDD1H) positive video digital signals into analog voltage-amplitude (VGND to VDD2H) positive video digital signals. The negative level shifters 80N convert low-amplitude (VDD1L to VGND) negative video digital signals into analog voltage-amplitude (VDD2L to VGND) negative video digital signals. A predetermined number of video digital data signals supplied from the data register latch circuit 700 are sent to the positive level shifters 80P or the negative level shifters 80N according to the polarity inversion signal POL, amplified to have the analog voltage-amplitude corresponding to the polarity, and sent to positive decoders 90P or negative decoders 90N.

The decoder circuit 900 has a configuration in which a pair of decoders including a positive decoder 90P and a negative decoder 90N is provided for each two outputs. Further, the disposition order of the decoders 90P and 90N for each polarity in the decoder circuit 900 can be changed.

The level voltage generation circuit 500 generates multiple positive level voltages and multiple negative level voltages having different voltage values, and supplies multiple positive level voltages to the positive decoders 90P and the multiple negative level voltages to the negative decoders 90N, respectively.

The decoder circuit 900 selects, for each polarity, a level voltage corresponding to a video digital signal that has been processed for level shifting from the above-described multiple level voltages for each two outputs of the pairs of the positive decoders 90P and the negative decoders 90N, and supplies each of the selected level voltage to the output amplifying circuit 2000.

The output amplifying circuit 2000 is configured as, for example, the output circuit 200 illustrated in FIG. 10. The output amplifying circuit 2000 receives the polarity inversion signals (POL) and a group of latch control signals, and calculates and amplifies each of the level voltages of each the polarity selected by the decoder circuit 900. Then, the output amplifying circuit 2000 outputs the positive voltage signal Vp to one of the two output terminals of the data driver 73 and the negative voltage signals Vn to the other output terminal according to the polarity inversion signals POL. Further, the output amplifying circuit 2000 performs control with the control signals S12 to S14, S22 to S24, S32 to S34, and S42 to S44 of the output circuit 200 of FIG. 10, for example, according to the polarity inversion signals POL such that the switches 12 to 14, 22 to 24, 32, to 34, and 42 to 44 are turned on and off. Further, the control part 201 (not shown) that generates each control signal of FIG. 10 may be built in the output amplifying circuit 2000 and commonly provided in multiple output circuit 200 of the output amplifying circuits 2000.

Further, in the block diagram of the data driver illustrated in FIG. 12, blocks having a voltage range of the analog voltage-amplitude are the level shifter circuit 800, the decoder circuit 900, the output amplifying circuit 2000, and the level voltage generation circuit 500.

The level voltage generation circuit 500 can be configured to be divided into a circuit block that generates multiple level voltages in the positive analog voltage range (VGND to VDD2H) and a circuit block that generates multiple level voltages in the negative analog voltage range (VDD2L to VGND). The output amplifying circuit 2000 can be configured with elements with a withstanding voltage in the positive analog voltage range (VGND to VDD2H) and elements with a withstanding voltage in the negative analog voltage range (VDD2L to VGND).

As described above, although the data driver illustrated in FIG. 12 outputs liquid crystal drive voltage signals in the voltage range from VDD2L to VDD2H of the negative voltage signal and the positive voltage signal from the output terminal, the elements constituting the data driver can be elements having the low element withstanding voltage VDD2T operable in the positive analog voltage range (VGND to VDD2H) or the negative analog voltage range (VDD2L to VGND) that is about half of the liquid crystal drive voltage range. In a case of a transistor with the low element withstanding voltage VDD2T, for example, the gate insulating film can be made thin, and an output circuit configured with such transistors can have a reduced area. In addition, element spacing can be narrowed by lowering withstanding voltages. Because the data driver of FIG. 12 is configured in a reduced area as described above, cost reduction can be realized. It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An output circuit comprising:
    a positive voltage signal supply circuit configured to supply a positive voltage signal having a higher voltage than a reference power supply voltage to a first node or to cut off supply of the positive voltage signal to the first node;
    a negative voltage signal supply circuit configured to supply a negative voltage signal having a lower voltage than the reference power supply voltage to a second node or to cut off supply of the negative voltage signal to the second node;
    a first output terminal;
    a first switch configured to be a P-channel transistor with a source connected to the first node and a drain connected to the first output terminal, to connect the first output terminal to the first node when in an ON state, and to cut off connection of the first output terminal to the first node when in an OFF state;
    a second switch configured to be an N-channel transistor with a source connected to the second node and a drain connected to the first output terminal, to connect the first output terminal to the second node when in an ON state, and to cut off connection of the first output terminal to the second node when in an OFF state;
    a third switch configured to apply the reference power supply voltage to the first node when in an ON state and to stop application of the reference power supply voltage to the first node when in an OFF state;
    a fourth switch configured to apply the reference power supply voltage to the second node when in an ON state and to stop application of the reference power supply voltage to the second node when in an OFF state;
    a first control section which, when active, sets the first switch to be in the OFF state;
    a second control section which, when active, sets the second switch to be in the OFF state;
    a first follower circuit configured to be connected to the first node and a gate of the first switch, include a first N-channel source follower transistor that performs a source follower operation by receiving a voltage signal of the first node at a gate of the first N-channel source follower transistor, generate a first gate voltage in phase with the voltage signal of the first node according to a voltage of a source of the first N-channel source follower transistor, and supply the first gate voltage to the gate of the first switch; and
    a second follower circuit configured to be connected to the second node and a gate of the second switch, include a first P-channel source follower transistor that performs a source follower operation by receiving a voltage signal of the second node at a gate of the first P-channel source follower transistor, generate a second gate voltage in phase with the voltage signal of the second node according to a voltage of a source of the first P-channel source follower transistor, and supply the second gate voltage to the gate of the first switch.

2. The output circuit according to claim 1,
    wherein the first follower circuit has a configuration in which the first N-channel source follower transistor and a first load element are cascade-connected between terminals of different power supply voltages and generates a voltage of a connection point of the source of the first N-channel source follower transistor and the first load element as the first gate voltage, and wherein the second follower circuit has a configuration in which the first P-channel source follower transistor and a second load element are cascade-connected between terminals of different power supply voltages and generates a voltage of a connection point of the source of the first P-channel source follower transistor and the second load element as the second gate voltage.

3. The output circuit according to claim 1,
wherein the first follower circuit has multiple positive sub-follower circuits connected in series,
each of the multiple positive sub-follower circuits includes an N-channel source follower transistor and a load element cascade-connected between different power supply voltage terminals, a gate of the N-channel source follower transistor is set as an input terminal, a connection point of a source of the N-channel source follower transistor and the load element is set as an output terminal,
the positive sub-follower circuit of a frontmost stage among the multiple positive sub-follower circuits has the input terminal connected to the first node, the positive sub-follower circuit of a last stage has the output terminal connected to the gate of the first switch, and
each of the positive sub-follower circuits excluding the positive sub-follower circuits of the frontmost and last stages among the multiple positive sub-follower circuits has the input terminal connected to the output terminal of the positive sub-follower circuit of a previous stage and has the output terminal connected to the input terminal of the positive sub-follower circuit of a subsequent stage, and
wherein the second follower circuit has multiple negative sub-follower circuits connected in series,
each of the multiple negative sub-follower circuits includes a P-channel source follower transistor and a load element cascade-connected between different power supply voltage terminals, a gate of the P-channel source follower transistor is set as an input terminal, a connection point of a source of the P-channel source follower transistor and the load element is set as an output terminal,
the negative sub-follower circuit of a frontmost stage among the multiple negative sub-follower circuits has the input terminal connected to the second node, the negative sub-follower circuit of a last stage has the output terminal connected to the gate of the second switch, and
each of the negative sub-follower circuits excluding the negative sub-follower circuits of the frontmost and last stages among the multiple negative sub-follower circuits has the input terminal connected to the output terminal of the negative sub-follower circuit of a previous stage and has the output terminal connected to the input terminal of the negative sub-follower circuit of a subsequent stage.

4. The output circuit according to claim 1,
wherein the first follower circuit includes a first positive sub-follower circuit and a second positive sub-follower circuit,
each of the first positive sub-follower circuit and the second positive sub-follower circuit includes an N-channel source follower transistor and a load element cascade-connected between different power supply voltage terminals, has a gate of the N-channel source follower transistor as an input terminal, and has a connection point of a source of the N-channel source follower transistor and the load element as an output terminal,
the first positive sub-follower circuit having the input terminal connected to the first node and the output terminal connected to the input terminal of the second positive sub-follower circuit, and the second positive sub-follower circuit having the output terminal connected to the gate of the first switch, and
wherein the second follower circuit includes a first negative sub-follower circuit and a second negative sub-follower circuit,
each of the first negative sub-follower circuit and the second negative sub-follower circuit includes a P-channel source follower transistor and a load element cascade-connected between different power supply voltage terminals, has a gate of the P-channel source follower transistor as an input terminal, and has a connection point of a source of the P-channel source follower transistor and the load element as an output terminal,
the first negative sub-follower circuit having the input terminal connected to the second node and the output terminal connected to the input terminal of the second negative sub-follower circuit, and the second negative sub-follower circuit having the output terminal connected to the gate of the second switch.

5. The output circuit according to claim 1, comprising:
a control part configured to control the third switch, the fourth switch, the first control section, the second control section, the positive voltage signal supply circuit, and the negative voltage signal supply circuit such that the positive voltage signal and the negative voltage signal are switched at a predetermined timing and output from the first output terminal.

6. The output circuit according to claim 2, comprising:
a control part configured to control the third switch, the fourth switch, the first control section, the second control section, the positive voltage signal supply circuit, and the negative voltage signal supply circuit such that the positive voltage signal and the negative voltage signal are switched at a predetermined timing and output from the first output terminal.

7. The output circuit according to claim 3, comprising:
a control part configured to control the third switch, the fourth switch, the first control section, the second control section, the positive voltage signal supply circuit, and the negative voltage signal supply circuit such that the positive voltage signal and the negative voltage signal are switched at a predetermined timing and output from the first output terminal.

8. The output circuit according to claim 4, comprising:
a control part configured to control the third switch, the fourth switch, the first control section, the second control section, the positive voltage signal supply circuit, and the negative voltage signal supply circuit such that the positive voltage signal and the negative voltage signal are switched at a predetermined timing and output from the first output terminal.

9. The output circuit according to claim 5,
wherein, when the positive voltage signal is to be output from the first output terminal, the control part performs control such that the third switch is in the OFF state, the fourth switch is in the ON state, the first control section is in an inactive state, and the second control section is in an active state, and controls the positive voltage signal supply circuit such that the positive voltage signal is supplied to the first node, and controls the negative voltage signal supply circuit such that supply of the negative voltage signal to the second node is cut off, and wherein, when the negative voltage signal is to be output from the first output terminal, the control part performs control such that the third switch is in the ON state, the fourth switch is in the OFF state, the first control section is in an active state, and the second control section is in an inactive state, and controls the negative voltage signal supply circuit such that the negative voltage signal is supplied to the second node, and controls the positive voltage signal supply circuit such that supply of the positive voltage signal to the first node is cut off.

10. The output circuit according to claim 5,
wherein the control part has, as control periods, a first period in preparing for switching an output of the negative voltage signal to an output of the positive voltage signal, a second period in which the positive voltage signal is output from the first output terminal, a third period in preparing for switching an output of the positive voltage signal to an output of the negative voltage signal, and a fourth period in which the negative voltage signal is output from the first output terminal, wherein, in the first period and the third period, supply of the positive voltage signal by the positive voltage signal supply circuit is cut off and supply of the negative voltage signal by the negative voltage signal supply circuit is cut off, the third switch and the fourth switch are both controlled to the ON state, the first control section and the second control section control at least one of the first switch and the second switch to the ON state, and as a result the first output terminal, the first node, and the second node are set to a state of the reference power supply voltage, wherein, in the second period, supply of the negative voltage signal by the negative voltage signal supply circuit is cut off and the positive voltage signal is supplied to the first node by the positive voltage signal supply circuit, control is performed such that the third switch is in the OFF state, the fourth switch is in the ON state, the first control section is in an inactive state, and the second control section is in an active state, and as a result the positive voltage signal is supplied to the first output terminal via the first switch, and wherein, in the fourth period, supply of the positive voltage signal by the positive voltage signal supply circuit is cut off and the negative voltage signal is supplied to the second node by the negative voltage signal supply circuit, control is performed such that the third switch is in the ON state, the fourth switch is in the OFF state, the first control section is in an active state, and the second control section is in an inactive state, and as a result the negative voltage signal is supplied to the first output terminal via the second switch.

11. The output circuit according to claim 9,
wherein the control part has, as control periods, a first period in preparing for switching an output of the negative voltage signal to an output of the positive voltage signal, a second period in which the positive voltage signal is output from the first output terminal, a third period in preparing for switching an output of the positive voltage signal to an output of the negative voltage signal, and a fourth period in which the negative voltage signal is output from the first output terminal, wherein, in the first period and the third period, supply of the positive voltage signal by the positive voltage signal supply circuit is cut off and supply of the negative voltage signal by the negative voltage signal supply circuit is cut off, the third switch and the fourth switch are both controlled to the ON state, the first control section and the second control section control at least one of the first switch and the second switch to the ON state, and as a result the first output terminal, the first node, and the second node are set to a state of the reference power supply voltage, wherein, in the second period, supply of the negative voltage signal by the negative voltage signal supply circuit is cut off and the positive voltage signal is supplied to the first node by the positive voltage signal supply circuit, control is performed such that the third switch is in the OFF state, the fourth switch is in the ON state, the first control section is in an inactive state, and the second control section is in an active state, and as a result the positive voltage signal is supplied to the first output terminal via the first switch, and wherein, in the fourth period, supply of the positive voltage signal by the positive voltage signal supply circuit is cut off and the negative voltage signal is supplied to the second node by the negative voltage signal supply circuit, control is performed such that the third switch is in the ON state, the fourth switch is in the OFF state, the first control section is in an active state, and the second control section is in an inactive state, and as a result the negative voltage signal is supplied to the first output terminal via the second switch.

12. The output circuit according to claim 5, further comprising:

a second output terminal;

a third node and a fourth node;

a fifth switch configured to be a P-channel transistor with a source connected to the third node and a drain connected to the second output terminal, to connect the second output terminal to the third node when in an ON state, and to cut off connection of the second output terminal to the third node when in an OFF state;

a sixth switch configured to be an N-channel transistor with a source connected to the fourth node and a drain connected to the second output terminal, to connect the second output terminal to the fourth node when in an ON state, and to cut off connection of the second output terminal to the fourth node when in an OFF state;

a seventh switch configured to apply the reference power supply voltage to the third node when in an ON state and to stop application of the reference power supply voltage to the third node when in an OFF state;

an eighth switch configured to apply the reference power supply voltage to the fourth node when in an ON state and to stop application of the reference power supply voltage to the fourth node when in an OFF state;

a third control section which, when active, sets the fifth switch to be in the OFF state;

a fourth control section which, when active, sets the sixth switch to be in the OFF state;

a third follower circuit configured to be connected to the third node and a gate of the fifth switch, include a second N-channel source follower transistor that performs a source follower operation by receiving a voltage signal of the third node at a gate of the second N-channel source follower transistor, generate a third gate voltage in phase with the voltage signal of the third node according to a voltage of a source of the second N-channel source follower transistor, and supply the third gate voltage to the gate of the fifth switch; and a fourth follower circuit configured to be connected to the fourth node and a gate of the sixth switch, include a second P-channel source follower transistor that performs a source follower operation by receiving a voltage signal of the fourth node at a gate of the second P-channel source follower transistor, generate a fourth gate voltage in phase with the voltage signal of the fourth node according to a voltage of a source of the second P-channel source follower transistor, and supply the fourth gate voltage to the gate of the sixth switch, wherein the positive voltage signal supply circuit controls supply of the positive voltage signal to the first node or the third node or cut-off of the supply, and wherein the negative voltage signal supply circuit controls supply of the negative voltage signal to the second node or the fourth node or cut-off of the supply.

13. The output circuit according to claim 9, further comprising:

a second output terminal;

a third node and a fourth node;

a fifth switch configured to be a P-channel transistor with a source connected to the third node and a drain connected to the second output terminal, to connect the second output terminal to the third node when in an ON state, and to cut off connection of the second output terminal to the third node when in an OFF state;

a sixth switch configured to be an N-channel transistor with a source connected to the fourth node and a drain connected to the second output terminal, to connect the second output terminal to the fourth node when in an ON state, and to cut off connection of the second output terminal to the fourth node when in an OFF state;

a seventh switch configured to apply the reference power supply voltage to the third node when in an ON state and to stop application of the reference power supply voltage to the third node when in an OFF state;

an eighth switch configured to apply the reference power supply voltage to the fourth node when in an ON state and to stop application of the reference power supply voltage to the fourth node when in an OFF state;

a third control section which, when active, sets the fifth switch to be in the OFF state;

a fourth control section which, when active, sets the sixth switch to be in the OFF state;

a third follower circuit configured to be connected to the third node and a gate of the fifth switch, include a second N-channel source follower transistor that performs a source follower operation by receiving a voltage signal of the third node at a gate of the second N-channel source follower transistor, generate a third gate voltage in phase with the voltage signal of the third node according to a voltage of a source of the second N-channel source follower transistor, and supply the third gate voltage to the gate of the fifth switch; and a fourth follower circuit configured to be connected to the fourth node and a gate of the sixth switch, include a second P-channel source follower transistor that performs a source follower operation by receiving a voltage signal of the fourth node at a gate of the second P-channel source follower transistor, generate a fourth gate voltage in phase with the voltage signal of the fourth node according to a voltage of a source of the second P-channel source follower transistor, and supply the fourth gate voltage to the gate of the sixth switch, wherein the positive voltage signal supply circuit controls supply of the positive voltage signal to the first node or the third node or cut-off of the supply, and wherein the negative voltage signal supply circuit controls supply of the negative voltage signal to the second node or the fourth node or cut-off of the supply.

14. The output circuit according to claim 10, further comprising:

a second output terminal;

a third node and a fourth node;

a fifth switch configured to be a P-channel transistor with a source connected to the third node and a drain connected to the second output terminal, to connect the second output terminal to the third node when in an ON state, and to cut off connection of the second output terminal to the third node when in an OFF state;

a sixth switch configured to be an N-channel transistor with a source connected to the fourth node and a drain connected to the second output terminal, to connect the second output terminal to the fourth node when in an ON state, and to cut off connection of the second output terminal to the fourth node when in an OFF state;

a seventh switch configured to apply the reference power supply voltage to the third node when in an ON state and to stop application of the reference power supply voltage to the third node when in an OFF state;

an eighth switch configured to apply the reference power supply voltage to the fourth node when in an ON state and to stop application of the reference power supply voltage to the fourth node when in an OFF state;

a third control section which, when active, sets the fifth switch to be in the OFF state;

a fourth control section which, when active, sets the sixth switch to be in the OFF state;

a third follower circuit configured to be connected to the third node and a gate of the fifth switch, include a second N-channel source follower transistor that performs a source follower operation by receiving a voltage signal of the third node at a gate of the second N-channel source follower transistor, generate a third gate voltage in phase with the voltage signal of the third node according to a voltage of a source of the second N-channel source follower transistor, and supply the third gate voltage to the gate of the fifth switch; and a fourth follower circuit configured to be connected to the fourth node and a gate of the sixth switch, include a second P-channel source follower transistor that performs a source follower operation by receiving a voltage signal of the fourth node at a gate of the second P-channel source follower transistor, generate a fourth gate voltage in phase with the voltage signal of the fourth node according to a voltage of a source of the second P-channel source follower transistor, and supply the fourth gate voltage to the gate of the sixth switch, wherein the positive voltage signal supply circuit controls supply of the positive voltage signal to the first node or the third node or cut-off of the supply, and wherein the negative voltage signal supply circuit controls supply of the negative voltage signal to the second node or the fourth node or cut-off of the supply.

15. The output circuit according to claim 12,
wherein, when the positive voltage signal is to be output from the second output terminal, the control part performs control such that the seventh switch is in the OFF state, the eighth switch is in the ON state, the third control section is in an inactive state, and the fourth control section is in an active state, and controls the positive voltage signal supply circuit such that the positive voltage signal is supplied to the third node, and controls the negative voltage signal supply circuit such that supply of the negative voltage signal to the fourth node is cut off, and wherein, when the negative voltage signal is to be output from the second output terminal, the control part performs control such that the seventh switch is in the ON state, the eighth switch is in the OFF state, the third control section is in an active state, and the fourth control section is in an inactive state, and controls the negative voltage signal supply circuit such that the negative voltage signal is supplied to the fourth node, and controls the positive voltage signal supply circuit such that supply of the positive voltage signal to the third node is cut off.

16. A data driver comprising:
a plurality of the output circuits according to claim 1,
wherein a plurality of gradation voltage signals having a positive or negative voltage value for driving a plurality of data lines of a liquid crystal display panel is output from the plurality of output circuits.

17. A data driver comprising:
a plurality of the output circuits according to claim 2,
wherein a plurality of gradation voltage signals having a positive or negative voltage value for driving a plurality of data lines of a liquid crystal display panel is output from the plurality of output circuits.

18. A data driver comprising:
a plurality of the output circuits according to claim 3,
wherein a plurality of gradation voltage signals having a positive or negative voltage value for driving a plurality of data lines of a liquid crystal display panel is output from the plurality of output circuits.

19. A data driver comprising:
a plurality of the output circuits according to claim 4,
wherein a plurality of gradation voltage signals having a positive or negative voltage value for driving a plurality of data lines of a liquid crystal display panel is output from the plurality of output circuits.

20. A display apparatus comprising:
a data driver including a plurality of the output circuits according to claim 1, in which a plurality of gradation voltage signals having a positive or negative voltage value is output from the plurality of output circuits; and
a liquid crystal display panel with a plurality of data lines for receiving the plurality of gradation voltage signals.

* * * * *